(12) United States Patent
Dechaumphai et al.

(10) Patent No.: US 11,558,010 B2
(45) Date of Patent: Jan. 17, 2023

(54) METHOD FOR BLACKENING AN ELECTRICAL CONDUIT

(71) Applicant: Merlin Solar Technologies, Inc., San Jose, CA (US)

(72) Inventors: Edward Dechaumphai, Bangkok (TH); Venkatesan Murali, San Jose, CA (US); Sarinee Prompanut, Lamphun (TH); Chagkapong Chitsamart, Phranakhon Si Ayutthaya (TH); Niphon Lapanaphan, Nontaburi (TH)

(73) Assignee: Merlin Solar Technologies, Inc., San Jose, CA (US)

( * ) Notice: Subject to any disclaimer, the term of this patent is extended or adjusted under 35 U.S.C. 154(b) by 139 days.

(21) Appl. No.: 17/249,143

(22) Filed: Feb. 22, 2021

(65) Prior Publication Data

US 2022/0271709 A1 Aug. 25, 2022

(51) Int. Cl.
*H02S 40/36* (2014.01)
*H02S 50/15* (2014.01)
*H02S 40/34* (2014.01)

(52) U.S. Cl.
CPC .............. *H02S 40/36* (2014.12); *H02S 40/34* (2014.12); *H02S 50/15* (2014.12)

(58) Field of Classification Search
None
See application file for complete search history.

(56) References Cited

U.S. PATENT DOCUMENTS

| 3,657,023 A | 4/1972 | Grunwald et al. |
| 5,393,353 A | 2/1995 | Bishop |
| 7,517,709 B1 | 4/2009 | Borden |

(Continued)

FOREIGN PATENT DOCUMENTS

| JP | 2017022231 A | 1/2017 |
| JP | 2017025382 A | 2/2017 |

(Continued)

OTHER PUBLICATIONS

International Search Report dated Oct. 21, 2019 for PCT Patent Application No. PCT/US19/39436.

(Continued)

*Primary Examiner* — John P. Dulka
*Assistant Examiner* — Haidong Zhang
(74) *Attorney, Agent, or Firm* — MLO, a professional corp.

(57) ABSTRACT

A method includes providing a mandrel having an electrical conduit electroformed in the mandrel. The second side of the electrical conduit is blackened while in the mandrel to create a black layer on the electrical conduit. The mandrel is aligned in a flatness fixture such that the mandrel is substantially flat. The mandrel remains flat and in a fixed relationship to the flatness fixture throughout the method. A beam of a laser is controlled toward the black layer. The beam has laser parameters including a power output, a frequency and a mark speed, and selected by setting the power output and the mark speed then determining the frequency. The beam removes a plurality of the portions of the black layer. Each removed portion of the plurality of the portions has a thickness equal to the black layer thickness, and a portion area of 9 mm$^2$ to 18 mm$^2$.

20 Claims, 19 Drawing Sheets

(56) References Cited

U.S. PATENT DOCUMENTS

| | | |
|---|---|---|
| 8,258,426 B2 | 9/2012 | Zhang et al. |
| 8,916,038 B2 | 12/2014 | Babayan et al. |
| 8,936,709 B2 | 1/2015 | Babayan et al. |
| 9,952,481 B2 | 4/2018 | Rozbicki et al. |
| 2001/0029975 A1 | 10/2001 | Takeyama et al. |
| 2003/0178058 A1 | 9/2003 | Jongerden et al. |
| 2004/0134882 A1 | 7/2004 | Mei |
| 2010/0021695 A1 | 1/2010 | Naoyuki et al. |
| 2011/0272009 A1 | 11/2011 | Cabral et al. |
| 2012/0228275 A1* | 9/2012 | Heinrici ............ B23K 26/40  219/121.72 |
| 2013/0220400 A1* | 8/2013 | Kim ............ H01L 31/1804  136/246 |
| 2014/0060612 A1 | 3/2014 | DiCenso et al. |
| 2014/0262793 A1 | 9/2014 | Babayan et al. |
| 2014/0318613 A1 | 10/2014 | Campe et al. |
| 2015/0129024 A1 | 5/2015 | Brainard et al. |
| 2015/0349167 A1 | 12/2015 | Morad et al. |
| 2015/0349175 A1 | 12/2015 | Morad et al. |
| 2016/0039032 A1 | 2/2016 | Vombrock et al. |
| 2017/0040480 A1 | 2/2017 | Cho et al. |
| 2017/0373211 A1 | 12/2017 | Murali et al. |
| 2018/0122973 A1 | 5/2018 | Pilliod et al. |
| 2020/0013913 A1 | 1/2020 | Chari et al. |
| 2020/0035848 A1 | 1/2020 | Terashita et al. |

FOREIGN PATENT DOCUMENTS

| | | |
|---|---|---|
| KR | 20140033424 A | 3/2014 |
| KR | 1020200050342 A | 5/2020 |
| KR | 1020200104693 A | 9/2020 |

OTHER PUBLICATIONS

Office Action dated Apr. 16, 2020 for U.S. Appl. No. 16/454,581.
International Search Report and Written Opinion dated May 13, 2022 for PCT Patent Application No. PCT/IB2022/051072.

* cited by examiner

SETTINGS FOR THE LASER PARAMETERS

| COMBINATION (1202) | FREQ (Hz) (1204) | MARK SPEED (mm/s) (1206) | POWER (W) (1208) |
|---|---|---|---|
| A | 150 | 100 | 16-20 |
| B | 600 | 500 | 16-20 |
| C | 1000 | 1000 | 16-20 |
| D | 1200 | 1200 | 16-20 |
| E | 2000 | 1500 | 16-20 |

1306
APPLYING A MASK ON THE BLACK LAYER ON A SECOND PLURALITY OF PORTIONS OF THE METALLIC STRIP OF THE METALLIC ARTICLE

1308
REMOVING A FIRST PLURALITY OF PORTIONS OF THE BLACK LAYER ON THE METALLIC STRIP OF THE METALLIC ARTICLE TO EXPOSE THE UNDERLYING ELECTROFORMED MATERIAL

1310
REMOVING THE MASK FROM THE SECOND PLURALITY OF PORTIONS OF THE BLACK LAYER

FIG. 13

METHOD FOR BLACKENING AN ELECTRICAL CONDUIT

BACKGROUND OF THE INVENTION

A solar cell is a device that converts photons into electrical energy. The electrical energy produced by the cell is collected through electrical contacts coupled to the semiconductor material, and is routed through interconnections with other photovoltaic cells in a module. The "standard cell" model of a solar cell has a semiconductor material, used to absorb the incoming solar energy and convert it to electrical energy, placed below an anti-reflective coating (ARC) layer, and above a metal backsheet. Electrical contact is typically made to the semiconductor surface with fire-through paste, which is metal paste that is heated such that the paste diffuses through the ARC layer and contacts the surface of the cell. The paste is generally patterned into a set of fingers and bus bars which will then be soldered with ribbon to other cells to create a module. Another type of solar cell has a semiconductor material sandwiched between transparent conductive oxide layers (TCO's), which are then coated with a final layer of conductive paste that is also configured in a finger/bus bar pattern.

Several solar cells may be connected together to form a solar cell circuit. This chaining of solar cells may be repeated to connect several solar cells in series to increase the output voltage of the solar cell circuit. The electrical contacts and interconnections of the light-facing side of the modules are typically a metal material which may be shiny, light-reflective, and have a high contrast in color compared to the solar cell to which it is attached, thus visible to the human eye. The electrical contacts and interconnections are usually composed of silver, which is expensive and its appearance is limited to silver or light gray color. Because of this, the module may not be aesthetically pleasing and detract from the particular application limiting the possible appearances of solar cells on roof tops such as solar shingles, on cars, trucks, or outdoor structures. In some applications, the presence of solar modules need to be undetectable such as in military operations. For example, solar energy may be collected and used for power generators, battery packs or wearable technology but the modules need to be stealth and not visible to the enemy to give away the position of the user.

SUMMARY OF THE INVENTION

A method of blackening a metallic electrical conduit for a photovoltaic cell is disclosed. The method includes providing a mandrel having an electrical conduit electroformed in the mandrel. The electrical conduit has a strip formed in a preformed pattern on an outer surface layer of the mandrel. The strip has a first side adjacent to the outer surface layer of the mandrel and a second side opposite the first side. The second side of the electrical conduit is blackened while in the mandrel to create a black layer on the electrical conduit. The black layer has a black layer thickness. The mandrel is aligned in a flatness fixture such that the mandrel is substantially flat. The mandrel remains flat and in a fixed relationship to the flatness fixture throughout the method. A beam of a laser is controlled toward the black layer. The beam is characterized by laser parameters including a power output, a frequency and a mark speed. The laser parameters are selected by setting the power output and the mark speed then determining the frequency so the beam removes a plurality of portions of the black layer. The beam of the laser removes a plurality of the portions of the black layer on the strip of the electrical conduit. Each removed portion of the plurality of the portions has a thickness equal to the black layer thickness, and a portion area of 9 mm$^2$ to 18 mm$^2$. The laser parameters comprise the power output in a range from 10 watts to 25 watts, the mark speed in a range from 100 millimeters/second to 2000 millimeters/second, and the frequency in a range from 100 hertz to 10,000 hertz.

A method of blackening an electroformed electrical conduit for a photovoltaic cell is disclosed. The method includes blackening a second side of the electroformed electrical conduit while in a mandrel to create a black layer on the electrical conduit. The electrical conduit has a strip formed in a preformed pattern on an outer surface layer of the mandrel. The strip has a first side adjacent to the outer surface layer of the mandrel and a second side opposite the first side. The black layer has a black layer thickness. A beam of a laser is controlled toward the black layer of the electrical conduit in the mandrel. The mandrel is aligned in a flatness fixture such that the mandrel is substantially flat. The mandrel remains flat and in a fixed relationship to the flatness fixture throughout the method. The beam is characterized by laser parameters including a power output, a frequency and a mark speed. The laser parameters are selected by setting the power output and the mark speed then determining the frequency so the beam removes a plurality of portions of the black layer. The beam of the laser removes a plurality of the portions of the black layer on the strip of the electrical conduit. Each removed portion of the plurality of the portions has a thickness equal to the black layer thickness, and a portion area of 9 mm$^2$ to 18 mm$^2$.

BRIEF DESCRIPTION OF THE DRAWINGS

Each of the aspects and embodiments of the invention described herein can be used alone or in combination with one another. The aspects and embodiments will now be described with reference to the attached drawings.

FIG. 12 is a table of settings for the laser parameters, in accordance with some embodiments.

FIGS. 13 and 14 are flowcharts for a method for blackening a metallic electrical conduit for a photovoltaic cell, in accordance with some embodiments.

DETAILED DESCRIPTION OF THE EMBODIMENTS

Figure 1:
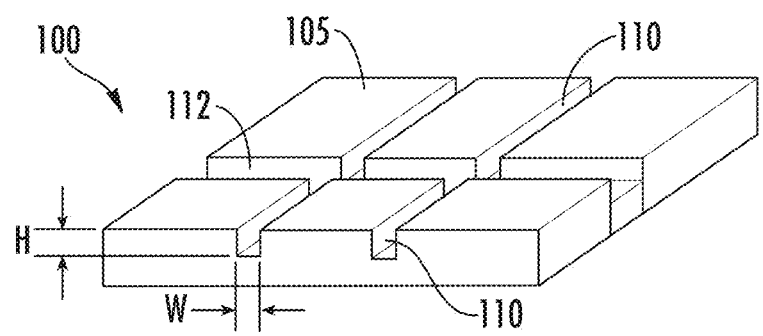
FIG. 1 depicts a perspective view of a portion of an electroforming mandrel, in accordance with some embodiments.

Metallization of solar cells is conventionally achieved with screen printed silver pastes on the surface of the cell, and cell-to-cell interconnections that utilize solder-coated ribbons. The metallic article of the present disclosure is manufactured in an electroforming mandrel, and formed in an electroforming process which generates a patterned metal layer that is tailored for a solar cell or other semiconductor device. For example, the metallic article, including an electrical conduit such as a cell-to-cell interconnect, may be plated or coated with a blackening material to create a black layer. In some embodiments, the blackening comprises depositing a tin-nickel alloy on the electroformed electrical conduit at room temperature which adheres to the electroformed material and eliminates the need for a seed layer and the use of corrosive chemicals.

The metallic article has a black layer or "blackened" surface that dramatically improves the aesthetic appearance of the solar module, without adversely affecting the efficiency of the product. The term "blackened" in this disclosure shall be used to describe adding a black layer to the metallic article, which will generally imply a dark or black color similar to the solar cell on which the metallic article is mounted. However, the present embodiments can be used to create other colors on the metallic articles as well.

Once the outer surface of the electrical conduit has been blackened, a removal process of a portion of the blackened material may be performed to, for example, expose the original, underlying electroformed material to serve as an electrical contact and for mechanical bonding to another solar cell. In some embodiments, the removal of the black layer on the outer surface of the electrical conduit may by laser ablation to ablate specific areas of the outer surface of the electrical conduit. In some embodiments, the removal process may use a mask-based process to selectively remove a portion of the black layer through an etching process.

Laser ablation is the process of using a highly focused beam to remove material from the surface by irradiating the material to a point that it evaporates. The laser beam is controlled by setting laser parameters such that short pulses of the beam remove the material so quickly that the surrounding material absorbs very little heat which prevents thermal distortion in the base material. The amount of material removed depends on the settings of the laser parameters. For example, the better the focus of the beam, the more efficient the laser is during ablation. Beams that are unfocused fail to generate the high energy required for ablation. Typically, laser parameters and a writing field are dictated by the application as there is a trade-off between a large writing field with laser beam spot size, focus and uniformity control. Therefore, the laser parameters must be optimized such that the laser beam is focused, and the spot size is small enough to ablate the material while being able to cover a sufficient ablation area. The amount of time for ablating large areas can be lengthy when compared to the amount of time for ablating very small areas so there is a greater risk of thermal damage to the workpiece when ablating large areas.

In the present disclosure, the blackened electroformed metallic article is ablated while in the mandrel. A flatness fixture is used to keep the mandrel completely flat and in a fixed relationship to the flatness fixture throughout the method. This enables the better focus of the beam so the ablation is performed at the correct depth. The unique combination of the laser parameters are selected by setting the power output and the mark speed then determining the frequency so the beam removes a plurality of portions of the black layer. In some embodiments, the settings enable only the black layer thickness deposited during the blackening to be removed. The heat from the beam is scattered quickly so that the critical temperature of the electroformed material is not reached. Having a thin, uniformly applied black layer in the blackening, enables the ablation at the right depth based on the unique laser parameters such as power output, frequency and mark speed without causing thermal distortion to the underlying material.

In some embodiments, the flatness fixture and unique combination of the laser parameters optimize a writing field. The writing field is a maximum view that the beam of the laser can ablate in a single run without moving the workpiece. An ablation section is the area where the actual ablation occurs and is located within the writing field. Ablating the desired area or more than one area in a single run without moving the workpiece increases the efficiency of the method.

In Babayan et al., U.S. patent application Ser. No. 13/798, 123, issued as U.S. Pat. No. 8,916,038 and incorporated herein by reference, electrical conduits for semiconductors such as photovoltaic cells are fabricated as an electroformed free-standing metallic article. The metallic articles are produced separately from a solar cell and can include multiple elements such as fingers and bus bars that can be transferred stably as a unitary piece and easily aligned to a semiconductor device. The elements of the metallic article are formed integrally with each other in the electroforming process. The metallic article is manufactured in an electroforming mandrel, which generates a patterned metal layer that is tailored for a solar cell or other semiconductor device. The metallic article can replace conventional bus bar metallization and ribbon stringing for cell metallization, cell-to-cell interconnection and module making. The ability to produce the metallization layer for a photovoltaic cell as an independent component that can be stably transferred between processing steps provides various advantages in material costs and manufacturing.

FIG. 1 depicts a perspective view of a portion of an electroforming mandrel 100 in accordance with some embodiments of U.S. Pat. No. 8,916,038. The mandrel 100 may be made of electrically conductive material such as stainless steel, copper, anodized aluminum, titanium, or molybdenum, nickel, nickel-iron alloy (e.g., Invar), copper, or any combinations of these metals, and may be designed with sufficient area to allow for high plating currents and enable high throughput. The mandrel 100 has an outer surface 105 with a preformed pattern that comprises pattern elements 110 and 112 and can be customized for a desired shape of the electrical conduit element to be produced. In this embodiment, the pattern elements 110 and 112 are grooves or trenches with a rectangular cross-section, although in other embodiments, the pattern elements 110 and 112 may have other cross-sectional shapes. The pattern elements 110 and 112 are depicted as intersecting segments to form a grid-type pattern, in which sets of parallel lines intersect perpendicularly to each other in this embodiment.

The pattern elements 110 have a height 'H' and width 'W', where the height-to-width ratio defines an aspect ratio. By using the pattern elements 110 and 112 in the mandrel 100 to form a metallic article, the electroformed metallic parts can be tailored for photovoltaic applications. For example, the aspect ratio may be between about 0.01 and about 10 as desired, to meet shading constraints of a solar cell.

The aspect ratio, as well as the cross-sectional shape and longitudinal layout of the pattern elements, may be designed to meet desired specifications such as electrical current capacity, series resistance, shading losses, and cell layout. Any electroforming process can be used. For example, the metallic article may be formed by an electroforming process. In particular, because electroforming is generally an isotropic process, confining the electroforming with a pattern mandrel to customize the shape of the parts is a significant improvement for maximizing efficiency. Furthermore, although certain cross-sectional shapes may be unstable when placing them on a semiconductor surface, the customized patterns that may be produced through the use of a mandrel allows for features such as interconnecting lines to provide stability for these conduits. In some embodiments, for example, the preformed patterns may be configured as a continuous grid with intersecting lines. This configuration not only provides mechanical stability to the plurality of electroformed elements that form the grid, but also enables a low series resistance since the current is spread over more conduits. A grid-type structure can also increase the robustness of a cell. For example, if some portion of the grid becomes broken or non-functional, the electrical current can flow around the broken area due to the presence of the grid pattern.

Figure 2A:
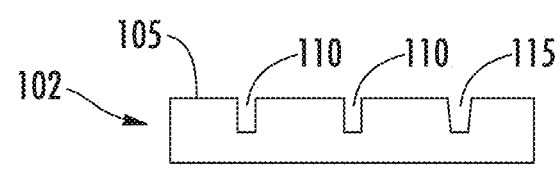
FIGS. 2A-2C depict cross-sectional views of stages in producing a free-standing electroformed metallic article, in accordance with some embodiments.
Figure 2B:
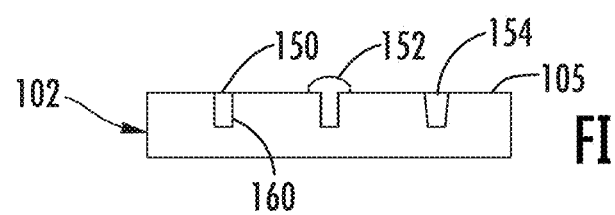
Figure 2C:
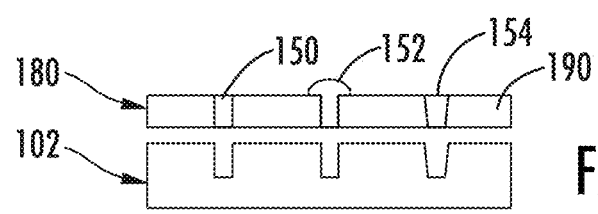

FIGS. 2A-2C are simplified cross-sectional views of stages in producing a metal layer piece using a mandrel in accordance with some embodiments, as disclosed in U.S. Pat. No. 8,916,038. In FIG. 2A, a mandrel 102 with pattern elements 110 and 115 is provided. The mandrel 102 is subjected to an electroforming process, in which electroformed elements 150, 152 and 154 are formed within the pattern elements 110 and 115 as shown in FIG. 2B. The electroformed elements 150, 152 and 154 may be, for example, copper only, or alloys of copper. In other embodiments, a layer of nickel may be plated onto the mandrel 102 first, followed by copper so that the nickel provides a barrier against copper contamination of a finished semiconductor device. An additional nickel layer may optionally be plated over the top of the electroformed elements to encapsulate the copper, as depicted by nickel layer 160 on electroformed element 150 in FIG. 2B. In other embodiments, multiple layers may be plated within the pattern elements 110 and 115, using various metals as desired to achieve the necessary properties of the metallic article to be produced.

In FIG. 2C the electroformed elements 150, 152 and 154 are removed from the mandrel 102 as a free-standing metallic article 180. Note that FIGS. 2A-2C demonstrate three different types of electroformed elements 150, 152 and 154. In various embodiments, the electroformed elements within the mandrel 102 may be all of the same type, or may have different combinations of electroformed patterns. The metallic article 180 may include intersecting elements 190, such as would be formed by the cross-member pattern elements 112 of FIG. 1. The intersecting elements 190 may assist in making the metallic article 180 a unitary, free-standing piece such that it may be easily transferred to other processing steps while keeping the individual electroformed elements 150, 152 and 154 aligned with each other. After the metallic article 180 is removed from mandrel 102 in FIG. 2C, the mandrel 102 may be reused to produce additional parts.

Although some embodiments shall be described in terms of electroforming, the present metallic articles may alternatively be formed by other methods such as etching, stamping, assembling of wires, or machining, such as by using a laser or water jet.

Figure 3:
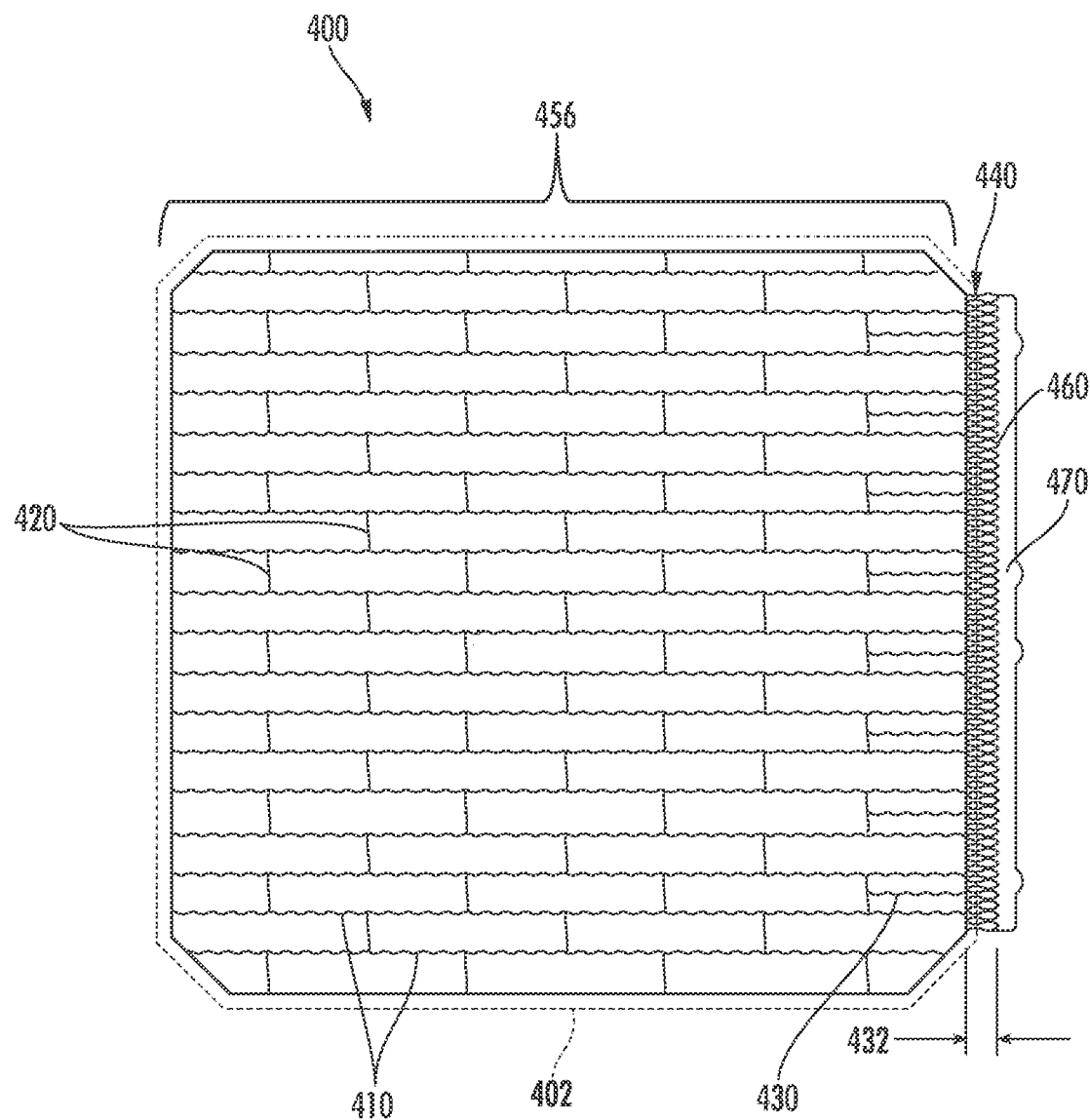
FIG. 3 shows a top view of a metallic article, in accordance with some embodiments.

FIG. 3 shows a top view of a metallic article 400 of the present disclosure in accordance with some embodiments of various features adapted for a photovoltaic cell. A semiconductor substrate 402 is shown in dashed lines to demonstrate the placement of metallic article on a photovoltaic cell, where the metallic article 400 is configured here as a grid for the front side of the cell. However, the features described herein may be applied to an electrical conduit for the back side of a photovoltaic cell. In this disclosure, reference to semiconductor materials in formation of a semiconductor device or photovoltaic cell may include amorphous silicon, crystalline silicon or any other semiconductor material suitable for use in a photovoltaic cell. The metallic articles may be also applied to other types of semiconductor devices other than photovoltaic cells. Semiconductor substrate 402 is shown in FIG. 3 as a mono-crystalline cell with rounded corners, also referred to as a pseudosquare shape. In other embodiments, the semiconductor substrate may be multi-crystalline, with a fully square shape.

The metallic article 400 includes a first region 456 having a plurality of electroformed elements that are configured to serve as an electrical conduit for a light-incident surface of the photovoltaic cell. A cell-to-cell interconnect 440 may be integral with the first region 456. In this embodiment of FIG. 3, grid lines 410 (in the horizontal direction in FIG. 3) and segments 420 (in the vertical direction in FIG. 3) in the first region 456 of metallic article 400 are electrically coupled to the semiconductor substrate 402, such as by soldering, to collect and deliver the current to the interconnection element or the cell-to-cell interconnect 440. Grid lines 410 may be perpendicular to the edge of the first region 456. The cell-to-cell interconnect 440 is an electrical conduit and enables the cell-to-cell connections for a solar module to create a solar array. Fabricating metallic article 400 with a metal such as copper reduces the cost compared to a cell in which silver is used for all the electrical conduits, and can also improve cell efficiency due to improved conductivity.

In the embodiment of FIG. 3, the grid lines 410 have a wave-type pattern as highlighted in the circle labelled as D. Also, the segments 420 have a wave-type pattern. Near the cell-to-cell interconnect 440, additional horizontal sections 430 may be present. The additional horizontal sections 430 provide additional current carrying capability. In other embodiments, the grid lines 410 and segments 420 may be linear or be a combination of wave-type pattern and linear.

The cell-to-cell interconnect 440 is near an edge of the metallic article 400 and may be integral with the first region 456. The cell-to-cell interconnect 440 is configured to extend beyond the light-incident surface of the first region 456 and to directly couple the metallic article 400 to a neighboring photovoltaic cell.

Figure 4A:
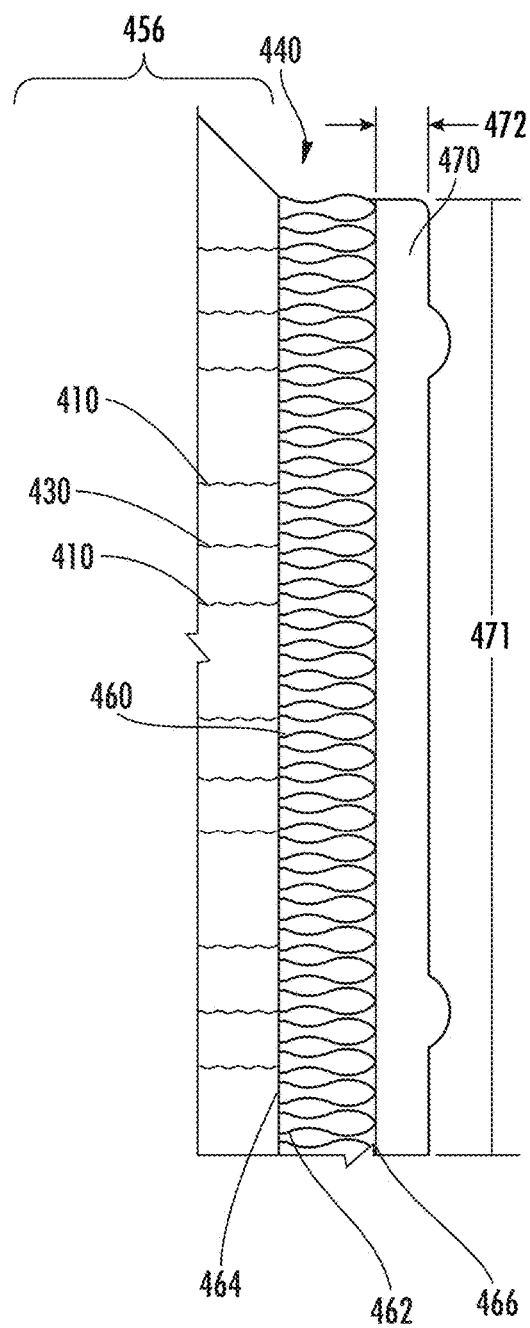
FIGS. 4A-4C are a close-up view of a cell-to-cell interconnect, in accordance with some embodiments.
Figure 4B:
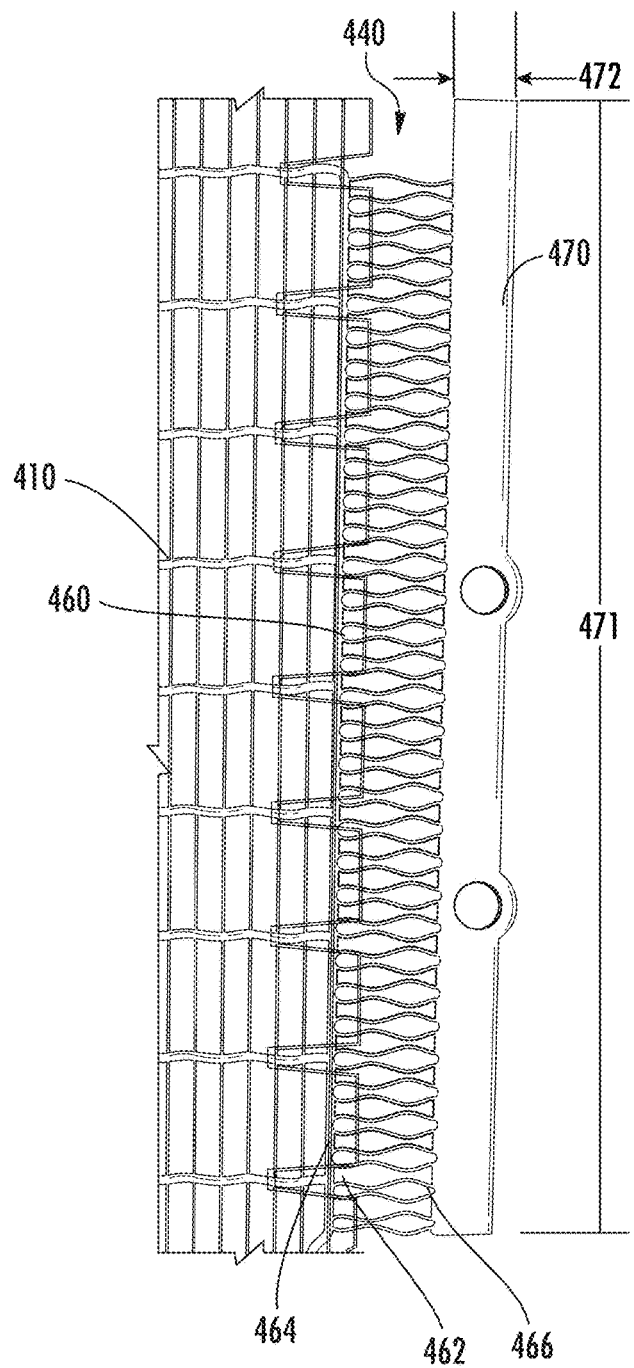

FIGS. 4A and 4B are a close-up view of a cell-to-cell interconnect, in accordance with some embodiments. In some embodiments, a length 471 of the metallic strip 470 is at least 34 millimeters, a width 472 of the metallic strip 470 is at least 4 millimeters, and a thickness (not shown) of the metallic strip 470 is 30-100 microns. The cell-to-cell interconnect 440 includes a plurality of electroformed, appendages 460. Each appendage 460 has a first end 462 coupled to an edge 464 of the first region 456 and a second end 466 opposite the first end 462 and away from the edge 464. That is, the second end 466 is coupled to a metallic strip 470 of cell-to-cell interconnect 440. The appendages 460 are spaced apart from each other. By having neighboring appendages 460 spaced apart—that is, not joined together—stress relief is improved due to the independent flexion and thermal expandability of each appendage. In some embodiments, each appendage 460 traverses a non-perpendicular path between the edge 464 of the first region 456 and the metallic strip 470. The pattern of appendages 460 form an outline of an hourglass or bowling pin shape comprised of curved surfaces within the original plane of the cell-to-cell interconnect 440, with little to no sharp or straight edges or angles. For example, the appendages may be nesting with one another.

Figure 4C:
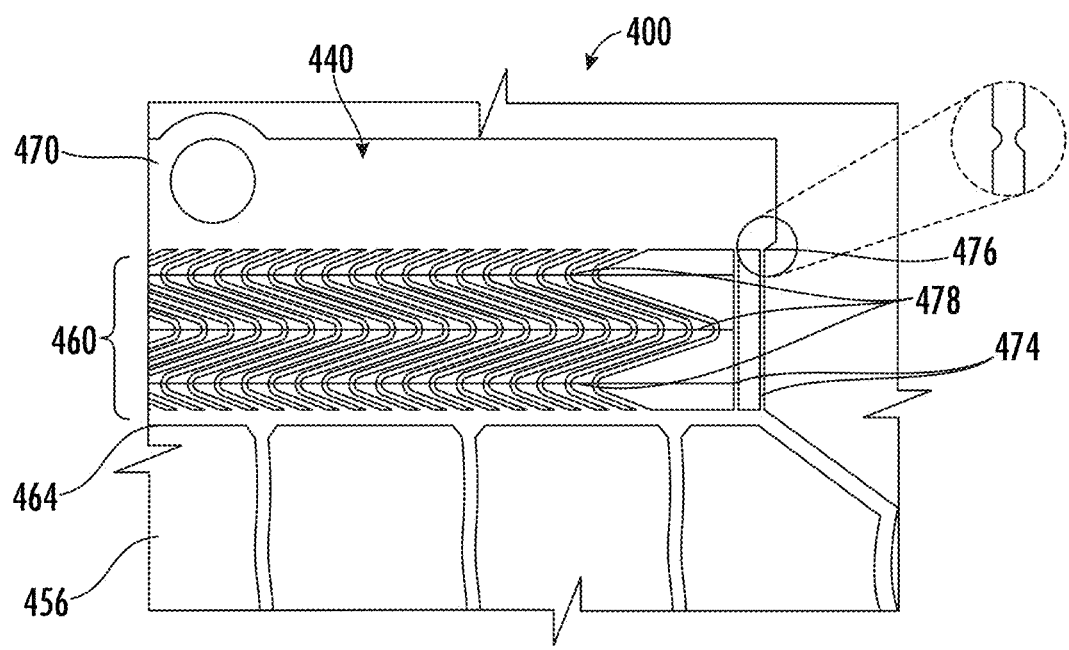

FIG. 4C shows a further feature that may be used to improve durability and manufacturability of the metallic articles, where the cell-to-cell interconnects 440 have one or more links 474. Each link 474 has a first link end coupled to an edge 464 of the first region 456 and a second link end opposite the first link end and away from the edge 464 of the first region 456. The second link end is coupled to the metallic strip 470 of the cell-to-cell interconnect 440. The link 474 is linear and is perpendicular to the edge of the first region 456. In some embodiments, each link 474 has a neck 476 which is tapered and narrower in width than the width of the link 474, to provide a designated breakage point for the link 474. In some embodiments, the cell-to-cell interconnect 440 may have one or more crossbars 478 extending across the appendages 460 and connecting one appendage 460 to a neighboring appendage 460.

Figure 5:
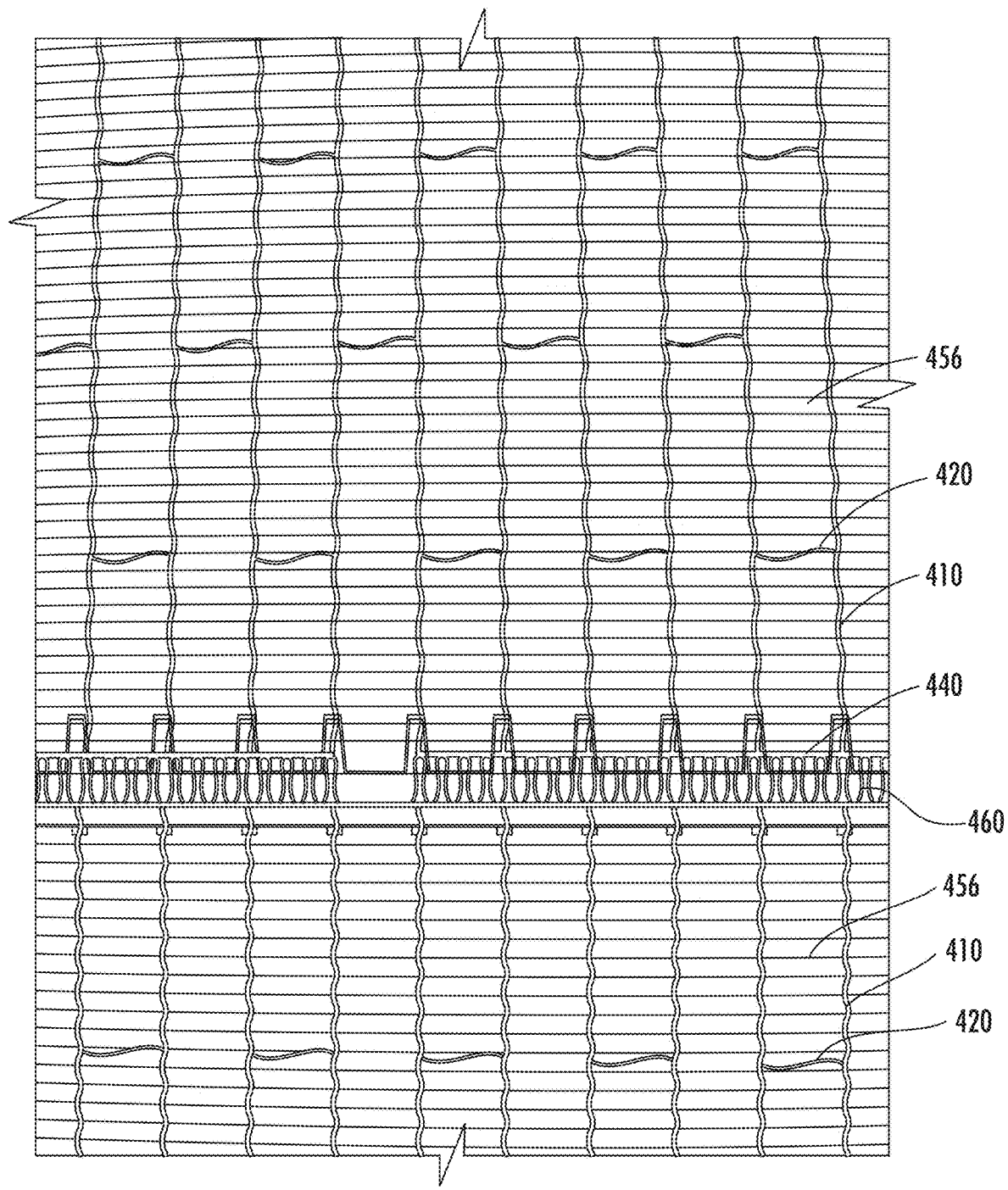
FIG. 5 illustrates a top view of the cell-to-cell interconnect extending from the front side of one photovoltaic cell and coupled to the back side of a neighboring photovoltaic cell, in accordance with some embodiments.

The cell-to-cell interconnect 440, also referred to as an electrical conduit, is configured to extend beyond the light-incident surface, and to directly couple the metallic article 400 to a neighboring photovoltaic cell. FIG. 5 illustrates a top view of the cell-to-cell interconnect 440 extending from the front side of one photovoltaic cell and coupled to the back side of a neighboring photovoltaic cell, in accordance with some embodiments. For example, in some embodiments, the metallic strip 470 of the metallic article 400 is integral with the cell-to-cell interconnect 440 and coupled to the second ends 466 of the plurality of electroformed appendages 460. The metallic strip 470 is configured to be coupled to a back side of the neighboring photovoltaic cell. The metallic strip 470 of the cell-to-cell interconnect 440 serves as a solder pad for the back of an adjacent cell, while the appendages 460 serve as electrical conduits between solar cells. As shown in FIG. 3, the width 432 of the cell-to-cell interconnect 440 may be at least 4 mm such as 4-7 mm, 5-10 mm or 6-8 mm.

The length of cell-to-cell interconnect 440 may approximate the edge length of a photovoltaic cell, such as the entire edge of a multi-crystalline cell or the length between corners of a mono-crystalline cell. In another embodiment, the cell-to-cell interconnect 440 may span at least one quarter of the edge of the first region 456 of the photovoltaic cell. In further embodiments, the cell-to-cell interconnect 440 may span nonconsecutive portions of the approximate edge length of a photovoltaic cell. In further embodiments, the cell-to-cell interconnect 440 may span nonconsecutive or consecutive portions of the edge entire length of a photovoltaic cell or the partial edge length of the photovoltaic cell. The metallic strip 470 spans the entire length of the photovoltaic cell. In another embodiment, the metallic strip 470 may span the length of the cell-to-cell interconnect 440.

The cell-to-cell interconnect 440 may have a height—that is, a thickness—that may be different from the rest of metallic article 400. The thickness of the cell-to-cell interconnect 440 may comprise a height that is different from a height of the plurality of electroformed elements. In some embodiments, for example, the cell-to-cell interconnect 440 may have a thickness of 30-100 microns while the grid lines 410 may have a thickness or height of 70-200 microns, such as 100-150 microns. Because the cell-to-cell interconnect 440 provides the mechanical, as well as electrical connections between cells in a module, the height may be tailored with a specific thickness to meet specified flex-testing requirements.

Once the metallic article 400 is formed on the electroforming mandrel 100, the plurality of electroformed elements are interconnected such that the metallic article 400 forms a unitary, free-standing piece when separated from the mandrel 100. Before separating the metallic article 400 from the mandrel 100, it may be desirable to create a black layer on the metallic article 400 for aesthetic concerns or additional functionality while the metallic article 400 is on the mandrel 100. For example, one side of the plurality of electroformed elements of the metallic article 400 may be blackened while the metallic article 400 is on the mandrel 100. After the blackening, it may be necessary to remove a portion of the black layer to expose the underlying electroformed material to provide an electrical contact and for mechanical bonding to a back side of the neighboring photovoltaic cell.

Figure 6:
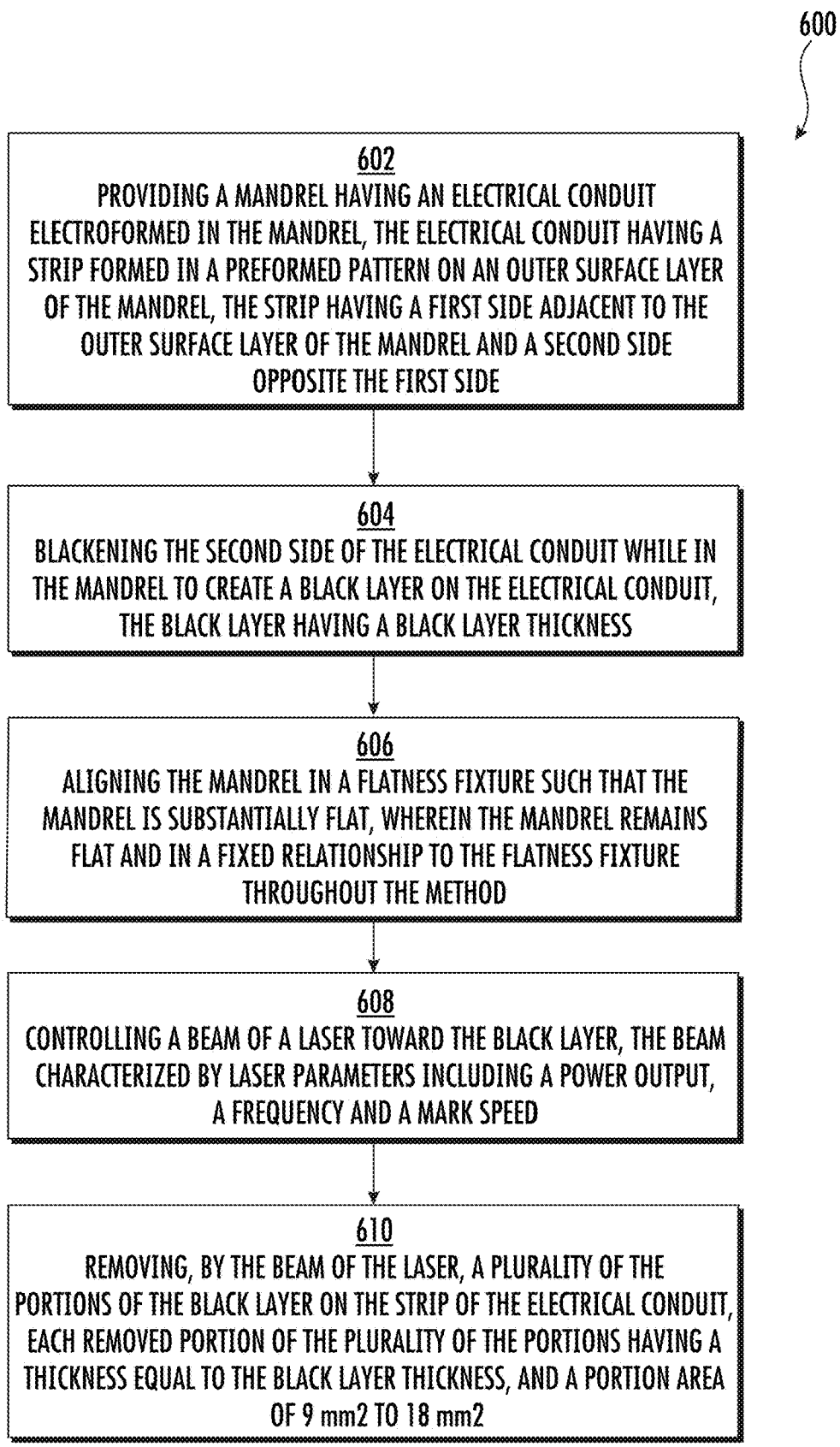
FIG. 6 is a flowchart for a method for blackening a metallic electrical conduit for a photovoltaic cell, in accordance with some embodiments.

FIG. 6 is a flowchart for a method 600 for blackening a metallic electrical conduit for a photovoltaic cell, in accordance with some embodiments. At step 602, a mandrel 100 having an electrical conduit electroformed in the mandrel is provided. The electroformed electrical conduit may be part of the metallic article 400. The electroformed electrical conduit is also known as the cell-to-cell interconnect 440 of the metallic article 400. The cell-to-cell interconnect 440 has a metallic strip 470 formed in a preformed pattern on an outer surface layer of the mandrel 100. The metallic strip 470 has a first side adjacent to the outer surface layer of the mandrel 100 and a second side opposite the first side. In some embodiments, the metallic strip 470 has a length of at least 34 millimeters, a width of at least 4 millimeters, and a thickness of 30-100 microns.

At step 604, the second side of the cell-to-cell interconnect 440, including the metallic strip 470, while in the mandrel, is blackened to create a black layer on the cell-to-cell interconnect 440. Since the mandrel includes the metallic article 400, the metallic article 400 is also blackened. This creates a black layer on the second side of the cell-to-cell interconnect 440 and the second side of the metallic article 400. The first side of the cell-to-cell interconnect 440 and the first side of the metallic article 400 are not blackened since the first side is adjacent to the outer surface layer of the mandrel 100. The blackening may be by plating, such as using an electrolytic process or electroless process. The blackening may use a metal or alloy such as a black nickel, black chromium, black zinc, tin-nickel alloy, or tin-cobalt alloy. The chemical recipe of the blackening dictates the color finish on the electrical conduit and may be adjusted to produce the desired color. In some embodiments, the black layer from blackening may be perceived as black, navy blue, brown, greenish/gray, or dark gray.

In some embodiments, the electroformed metallic article 400, including the cell-to-cell interconnect 440, comprises copper. Typically to blacken a copper surface, a seed layer such as a nickel layer is plated on the copper layer before applying black nickel for the blackening effect. This is done because black nickel does not adhere well to some metals, such as the copper layer, so by plating the nickel seed layer, the black nickel can adhere to the nickel layer instead of the copper layer. Having the nickel seed layer also improves the uniformity and color of blackness of the black nickel layer. Other black nickel plating processes may require the plating to be done at high temperatures and/or may use highly corrosive chemicals to cause the blackening which may damage the workpiece. These issues are eliminated by the present disclosure because in some embodiments, the blackening comprises depositing a tin-nickel alloy on the electroformed electrical conduit which adheres to the electroformed material eliminating the need for a seed layer. Additionally, the tin-nickel alloy can be applied at room temperature without the use of a strong acid or alkaline solution. Black nickel-plating processes known in the art typically require high temperature plating and/or highly corrosive chemicals which may damage the workpiece. In the present disclosure, the blackening chemicals of solutions must not damage the metallic articles 400 or the mandrel 100 during the plating process.

Figure 7A:
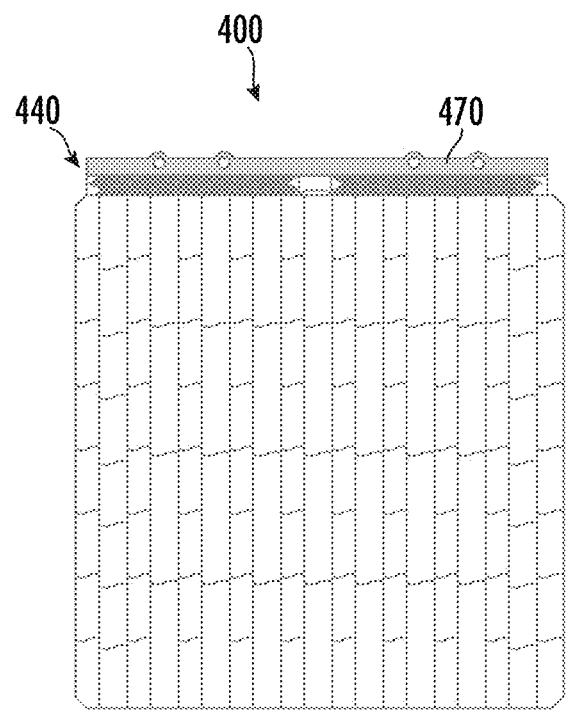
FIG. 7A is a top view of an electroformed metallic article, in accordance with some embodiments.
Figure 7B:
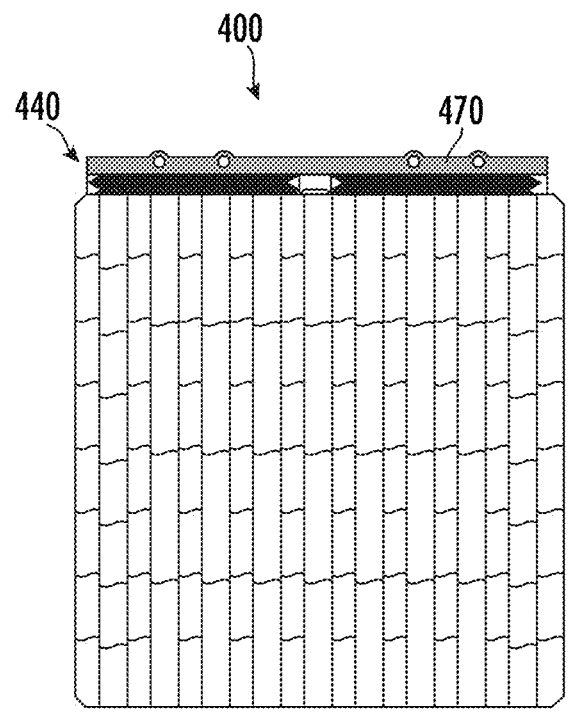
FIG. 7B is a top view of a blackened electroformed metallic article, in accordance with some embodiments.

The black layer created during the blackening has a black layer thickness. The black layer thickness is between 0.4 microns to 1.5 microns. In order to plate the desired black layer thickness uniformly, the electrical current of the plating is regulated to between 0.5 A/dm$^2$ to 4 A/dm$^2$ and may be varied in different areas of the workpiece to achieve the uniform thickness. This is a critical parameter as too much or too little electrical current affects the uniformity of the black layer, the surface color and/or surface smoothness of the black layer. FIG. 7A is a top view of the electroformed metallic article 400, in accordance with some embodiments, and FIG. 7B is a top view of the blackened electroformed metallic article 400, in accordance with some embodiments.

After the blackening, it may be necessary to remove a portion or a plurality of portions of the black layer on the metallic article 400, or more specifically, on the metallic strip 470 of the electrical conduit, to provide an electrical contact and bonding surface to be coupled to a back side of the neighboring photovoltaic cell. Generally, solder is used between the metallic article 400 and the neighboring photovoltaic cell to couple the surfaces together. Solder may have poor wettability on the black layer resulting in poor solderability and adhesion. To overcome solderability issues, one of the solutions is to remove portions of the black layer to expose the underlying metal with good solderability thus providing a better electrical contact for the coupling. The removal may be performed by a laser such that a beam of the laser may selectively remove a portion or a plurality of portions of the black layer on the metallic strip 470 of the metallic article 400. As used herein, the terms "remove" and "ablate" are used to mean remove or destroy the black layer. For example, the beam of the laser irradiates the material, such as the black layer, where the material is heated by the absorbed laser energy then evaporates or sublimates. Hence, the material is removed or destroyed. In another example, an etchant causes a chemical reaction and "takes away" the material so the material is removed or destroyed.

Figure 8:
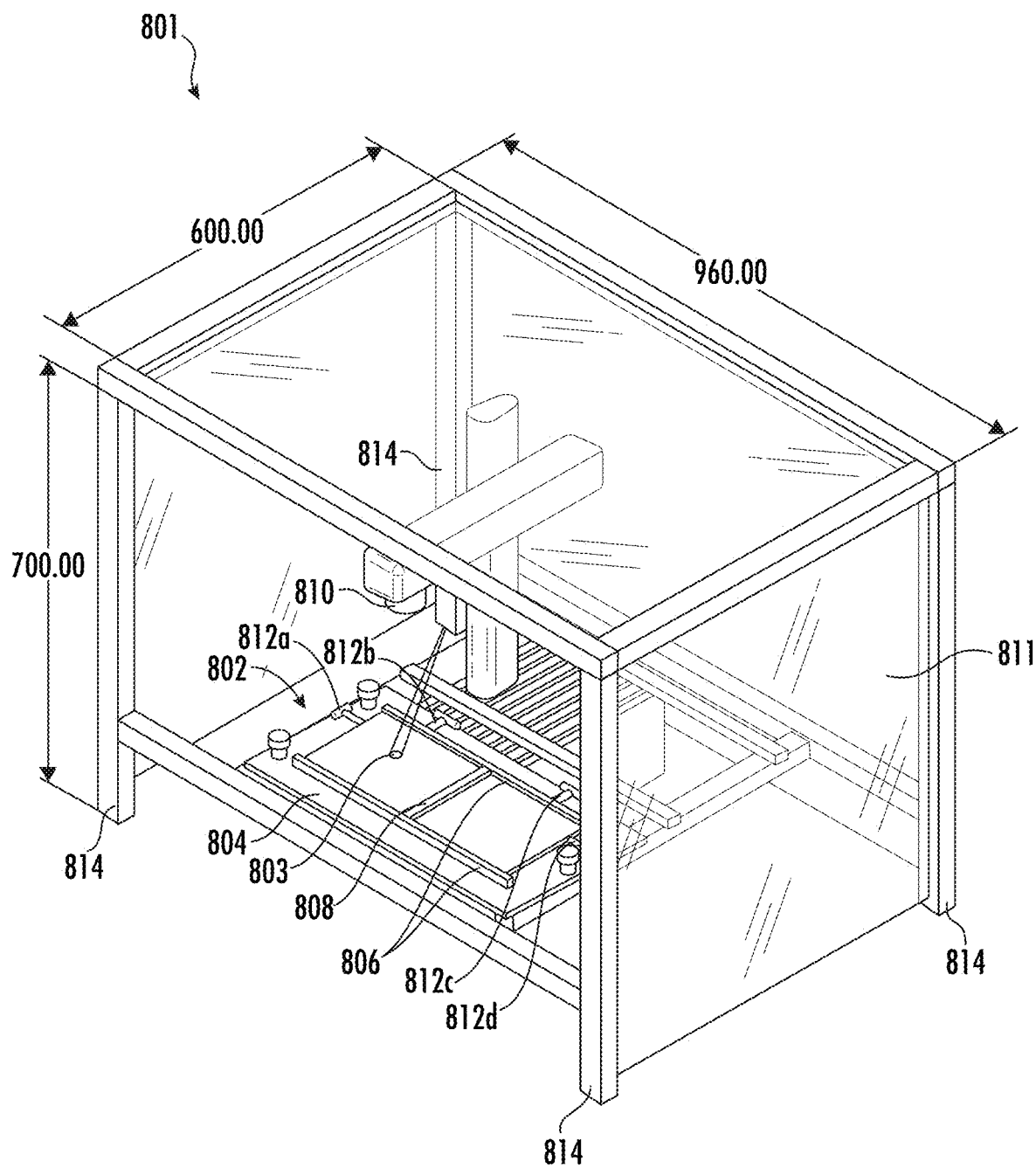
FIG. 8 is a perspective view of an apparatus for removing potions of blackened areas, in accordance with some embodiments.

FIG. 8 is a perspective view of an apparatus for removing potions of blackened areas, in accordance with some embodiments. Referring to FIG. 6, at step 606, the mandrel 100 with the metallic article 400, is aligned in a flatness fixture 802 of the apparatus 801 such that the mandrel 100 is substantially flat or in a two-dimensional position. The mandrel 100 remains flat and in a fixed relationship to the flatness fixture 802 throughout the method which beneficially enables laser ablation to be performed over larger areas than conventional methods. The flatness fixture 802 is configured to position the mandrel 100 in a level position in a plane perpendicular to a beam emitted from a laser 810. Circle 803 represents the beam on the workpiece. The flatness fixture 802 includes a base plate 804, side supports 806 and a cross support 808. In practice, the mandrel 100 is positioned on the top surface of the side supports 806 and the cross support 808 so the mandrel 100 is substantially flat. The side supports 806 and the cross support 808 may have a lip, groove or indentation along the length to assist with alignment. The side supports 806 and the cross support 808 enable the mandrel 100 to be substantially flat by supporting the mandrel 100. The cross support 808 prevents sag or warp in the center of the mandrel 100. The mandrel remains flat to the flatness fixture within +/−500 microns.

In some embodiments, the mandrel 100 includes one or more electroformed metallic articles 400 that have been fabricated in the mandrel 100, and the single mandrel 100 is mounted on the flatness fixture 802. In other embodiments, two or more mandrels 100 may be mounted on the flatness fixture 802 at the same time such that the two or more mandrels 100 are supported by the top surface of the side supports 806 and the cross support 808 so that the two or more mandrels 100 are substantially flat. In some embodiments, the laser 810 is located above the base plate 804, the mandrel 100 and the metallic article 400. A shield 811 may partially enclose the flatness fixture 802 and the laser 810. In some embodiments, the shield may have dimensions of 960 millimeters by 600 millimeters by 700 millimeters.

A plurality of brackets such as brackets 812a, 812b, 812c and 812d, aid to align the mandrel 100 on the flatness fixture 802 and hold the mandrel 100 in place during the method. This enables the mandrel 100 to remain flat and in a fixed relationship to the flatness fixture 802 throughout the method. For example, the mandrel 100 is positioned to contact the one or more brackets 812a, 812b, 812c and 812d. Since the mandrel 100 is substantially robust, the mandrel 100 is generally level and substantially flat while on the top surface of the side supports 806 and the cross support 808. The brackets 812a-812d include an adjustment mechanism to control the angle of the mandrel 100 while on the side supports 806 and the cross support 808 to level the mandrel 100. This may be adjusted manually or by a mechanical tool, as necessary, to achieve levelness of the mandrel 100. In some cases, legs 814 of the flatness fixture 802 or the base plate 804 may be shimmed so the mandrel 100 is substantially flat. Having the mandrel 100 flat and in a fixed relationship to the flatness fixture 802 throughout the method helps the beam of the laser 810 to focus on the workpiece over larger areas during the ablation than in conventional methods. The better the focus of the beam, the more efficient the laser is during ablation. Beams that are unfocused fail to generate the high energy required for ablation.

At step 608, the beam of the laser 810 is controlled toward the black layer on the metallic strip 470 and the metallic article 400. The beam of the laser 810 is characterized by laser parameters. The laser parameters include a power output, a frequency and a mark speed. The laser parameters are selected by setting the mark speed and the power output then determining the frequency so the beam removes a plurality of portions of the black layer. The power output of the laser 810 is the amount of energy absorbed into the workpiece. The frequency is the number of pulses of light from the beam of the laser per second, such as in hertz. The mark speed is the traveling speed of the beam of the laser 810 which describes the movement of the beam. For example, a fast mark speed causes the workpiece to have a short exposure time to the beam of the laser 810 while a slow mark speed causes the workpiece to have a longer exposure time to the beam of the laser 810.

The laser parameters are interrelated as the combination of these dictates the heat generation, conduction, cooling, interaction time and material removal. The settings for the laser parameters are critical to achieve ablation without damage to the metallic article 400, cell-to-cell interconnect 440, metallic strip 470 or mandrel 100. The laser 810 may be a solid-state infrared ytterbium laser. In some embodiments, other lasers may be used based on their properties, capabilities and performance. Different types of laser will require its own set of recipe/optimization. For instance, microsecond/nanosecond/femtosecond pulse lasers can be used, but each type will require different set of power output, mark speed and frequency combination. The power output of the laser 810 may be first selected due to its influence on the depth of penetration of the beam into the workpiece. The combination of the mark speed and frequency determines the number of repetitions the beam of the laser 810 pulses per a given portion. More repetitions of pulses in a single area leads to a deeper trench into the workpiece or a greater thickness of material removed. When the mark speed is too slow, the beam may excessively heat up the workpiece and cause damage by removing more than the desired amount of material, while when the mark speed is too high, the beam may not remove enough of the desired amount of material such as the black layer.

The mark speed setting is coordinated with the frequency setting. For example, a low frequency may generate a "spotted" removal of the material while a higher frequency allows "line" removal. When the mark speed is adjusted to a high value, the frequency is directly proportional to the mark speed and is also set to a high value. This will ensure sufficient pulses of the beam per the length and area of the portion. Increasing the mark speed increases the efficiency of manufacturing because more ablated workpieces can be completed in a shorter amount of time. The frequency is inversely proportional to the thermal penetration depth, which is the depth of the thermal boundary heated by laser, and influences the heating ablation depth. Therefore, ablation to the same depth at a higher frequency may require higher power. If the frequency is too high in order to increase mark speed to create a continuous ablation line, the power output may not be adequate for the ablation process. Trade-offs between manufacturing speed and ablation quality are uniquely addressed by both the uniformed thin black layer thickness by plating and the laser parameters of the present disclosure over conventional techniques. As such, the uniformity in black layer thickness, or having a consistent thickness of black layer, allows optimization in frequency for high mark speed while ablating portions of the black layer without damaging the underlying metal article.

The laser parameters are set to optimize the performance of the laser 810 to achieve the desired results. The laser 810 has a power output in a range from 10 watts to 25 watts and the beam size (refer to circle 803) between 10 microns to 100 microns. The mark speed may be in a range from 100 millimeters/second to 2000 millimeters/second, and the frequency may be in a range from 100 hertz to 10,000 hertz.

At step 610, a plurality of the portions of the black layer on the metallic strip 470 of the electrical conduit or the metallic article 400, are removed by, for example, laser ablation. Each removed portion of the plurality of the portions has a thickness equal to the black layer thickness, so that only the black layer is removed and there is no damage to the metallic article 400 or the mandrel 100 during the removal. Each removed portion of the plurality of the portions has a portion area of 9 mm$^2$ to 18 mm$^2$.

Damage to the metallic article 400, which includes the cell-to-cell interconnect 440 and the metallic strip 470, may include thermal distortion, defacement or material removal to the underlying electroformed material forming the metallic article 400. Damage to any part of the metallic article 400 may affect the performance of the solar module by causing an interruption in the current flow and degrade the performance. Further, damage to any part of the metallic article 400 may affect the aesthetics of the module and detract from the particular application.

Similarly, damage to the mandrel 100 may include thermal distortion, defacement or material removal to any surface of the mandrel 100. The mandrel 100 is designed to be reused in manufacturing the metallic article 400. Reusing the mandrel 100 provides a significant cost reduction compared to current techniques where electroplating is performed directly on a solar cell. Having a reusable mandrel 100 reduces processing steps and saves cost compared to techniques that require patterning and then plating a semiconductor device.

Completing the ablation of the workpiece without having to reposition the workpiece then ablate the same workpiece again, is desirable. A writing field is a maximum view that the beam of the laser 810 can ablate in a single run without moving the workpiece. An ablation section is the section where the ablation occurs and is located within the writing field. The writing field may be optimized depending on the desired ablation section. In order to complete the ablation of the workpiece in a single run without having to reposition the workpiece, when the desired ablation section is large, the writing field must also be large. When the writing field is small, the ablation section is likewise small since it is included in the writing field. In another scenario, there are multiple small ablation sections in a large writing area. Having to reposition the workpiece then ablating the same workpiece in multiple runs adds time to manufacturing which increases the cost and decreases the efficiency.

Figure 9A:
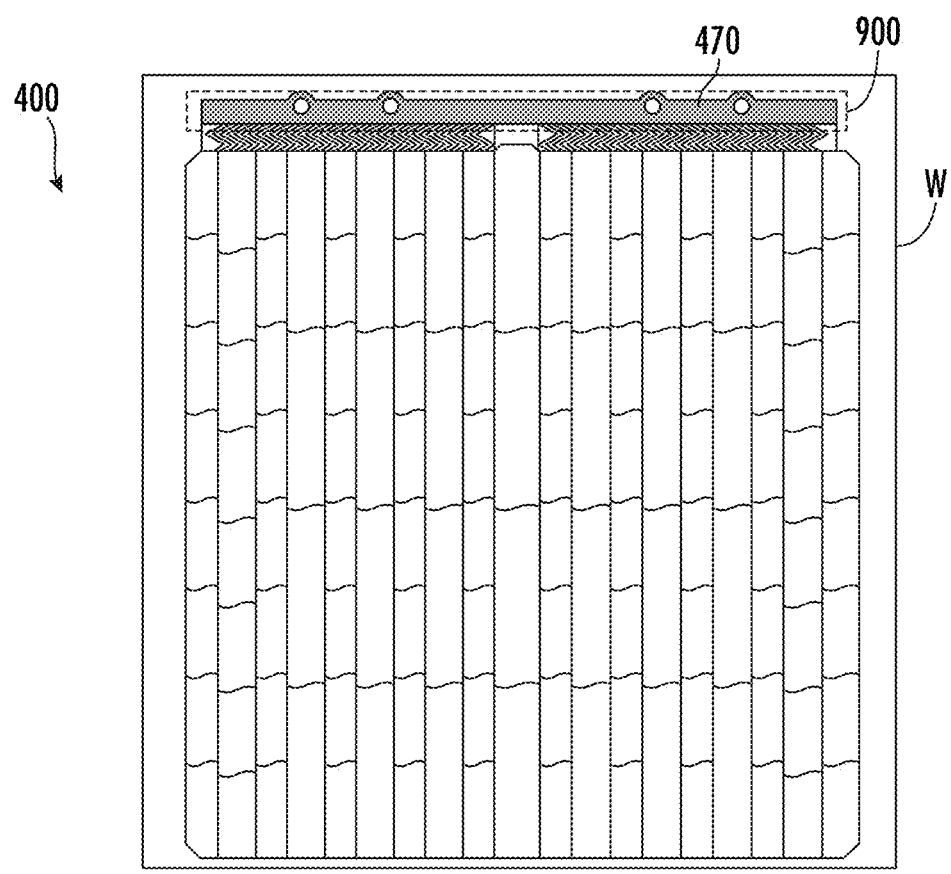
FIG. 9A shows an ablation section within a writing field on a top view of a blackened metallic article.

A larger writing field is more challenging than a smaller writing field because as the beam of the laser moves to the far extremes of the writing field, such as from far left to far right, the focus of the beam may vary resulting in variations of the ablated surface. In some embodiments, some areas of the workpiece may have different pulse rates. FIG. 9A shows an ablation section within a writing field on a top view of a blackened metallic article 400, in accordance with some embodiments. In some embodiments, the writing field for the given laser 810 based on some of the laser parameters, may be 200 millimeters by 200 millimeters. The metallic article 400 shown in FIG. 9A may have overall dimensions of 140 millimeters by 165 millimeters. In some embodiments, the metallic article 400 may have dimensions of a width in a range from 35-210 millimeters and a length in a range from 40-250 millimeters. The desired ablation is performed on portions the metallic strip 470 so those portions of the metallic strip 470 fit into the writing field of 200 millimeters by 200 millimeters. In this example, an ablation section 900 (shown in broken lines) for the metallic article 400 may be 150 millimeters by 9 millimeters. The box labeled W indicates the writing field.

Figure 9B:
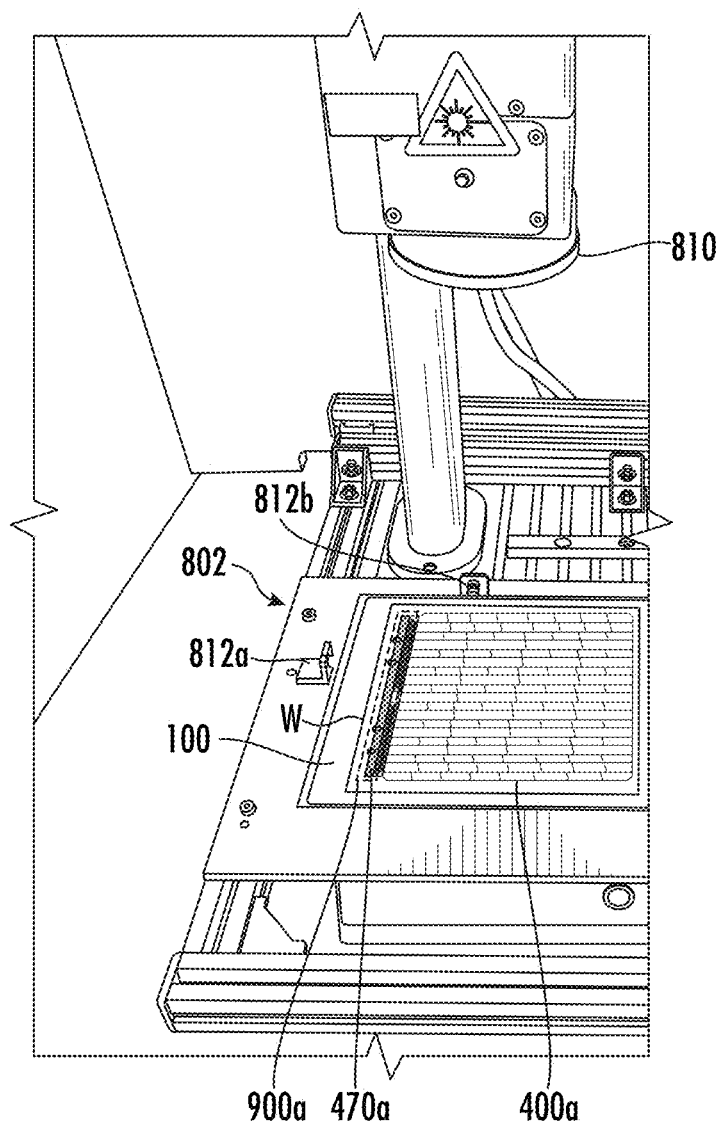
FIG. 9B shows a portion of a front surface of a mandrel on the flatness fixture, in accordance with some embodiments.

A plurality of metallic articles 400 may have been formed and blackened on the mandrel 100. FIG. 9B shows a portion of a front surface of a mandrel 100 on the flatness fixture 802, in accordance with some embodiments. In this example, a metallic article 400a is located on the front surface of the mandrel 100 and metallic article 400b (shown in FIG. 9C) is located on the back surface of the mandrel 100. The mandrel 100 is aligned with one or more brackets 812a, 812b, 812c and 812d. In some embodiments, two or more metallic articles 400 may be on the front surface of the mandrel 100 and two or more metallic articles 400 may be on the back surface of the mandrel 100.

In this configuration, each of the metallic strips, 470a and 470b, of metallic articles 400a and 400b respectively are in the mandrel 100 for ablation to remove portions of the black layer to provide an electrical contact and mechanical bonding surface to be coupled to a back side of the neighboring photovoltaic cell. The size of each metallic articles 400a and 400b may be approximately 100 millimeters by 165 millimeters. When there are two or more metallic articles 400, the metallic articles 400 may be spaced apart in the mandrel 100. The writing field W is 200 millimeters by 200 millimeters and only includes one metallic strip 470a. In this example, the ablation section 900a (shown in broken lines) for this configuration is 95 millimeters by 9 millimeters (also shown in FIG. 9A) so the ablation process is performed on only one metallic strip 470a in the single run since only metallic strip 470a fits into the writing field W of 200 millimeters by 200 millimeters. The mandrel 100 is repositioned to perform the ablation on any other metallic strips 470 on the mandrel 100 which are located outside of the writing field W. The repositioning of the mandrel 100 may be manually or by mechanical tools such as a conveyor belt or robot placing arms. In some embodiments, the ablation may be performed while the conveyor belt is moving.

For example, the mandrel 100 is aligned on the flatness fixture 802 with one or more of brackets 812a-812d. The metallic strip 470a is facing upward toward the laser 810. The ablation is performed on the metallic strip 470a within the ablation section 900a (shown in broken lines) since it falls within the writing field W. When there is more than one metallic article on the front surface of the mandrel 100, the mandrel 100 is repositioned, such as by sliding or rotating the mandrel 100 in the horizontal plane. In some embodiments, the mandrel 100 may be moved in the horizontal plane by 10-100 centimeters, rotated in the horizontal plane about 180 degrees or a combination thereof. The mandrel 100 is aligned in the flatness fixture 802 with one or more of brackets 812a-812d and the next metallic strip 470 is ablated within the ablation section 900. After completing the ablation on metallic strips 470 on the front surface of the mandrel 100, it is necessary to reposition the mandrel 100 again, such as flipping over the mandrel 100 so the back surface of the mandrel 100 is facing toward the laser 810. In other words, the mandrel 100 is rotated in the vertical plane 180 degrees so the metallic strip 470b of metallic article 400b on the mandrel 100 is facing the laser 810.

Figure 9C:
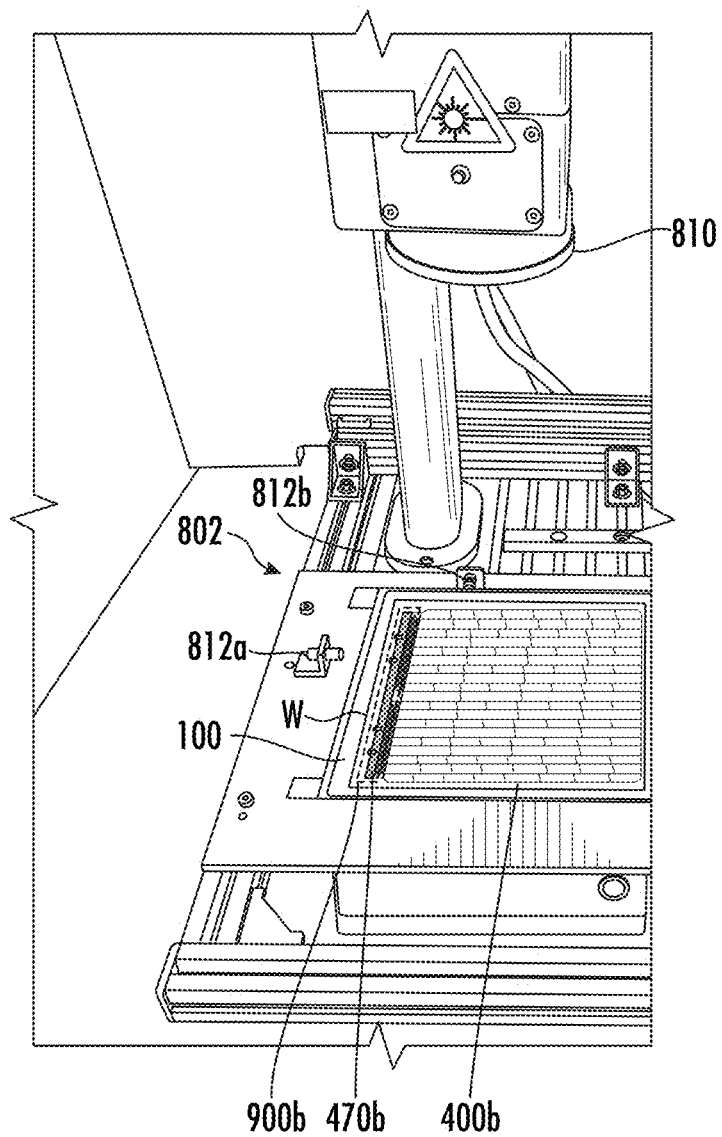
FIG. 9C depicts a portion of a back surface of a mandrel on the flatness fixture, in accordance with some embodiments.

FIG. 9C depicts a portion of a back surface of a mandrel 100 on the flatness fixture 802, in accordance with some embodiments. In this example, the metallic article 400b is located on the back surface of the mandrel 100 (FIG. 9B shows the front surface of the mandrel 100 with metallic article 400a). After the mandrel is aligned with one or more brackets 812a-812d, the ablation is performed on the metallic strip 470b within the ablation section 900b (shown in broken lines). In some embodiments, when more than one metallic article 400 is on the back surface of the mandrel 100, the mandrel 100 is repositioned, such as sliding or rotating the mandrel 100 in the horizontal plane as described herein. The mandrel 100 is aligned in the flatness fixture 802 with one or more brackets 812a-812d and the other metallic strips 470 are ablated within the ablation section 900.

Figure 10A:
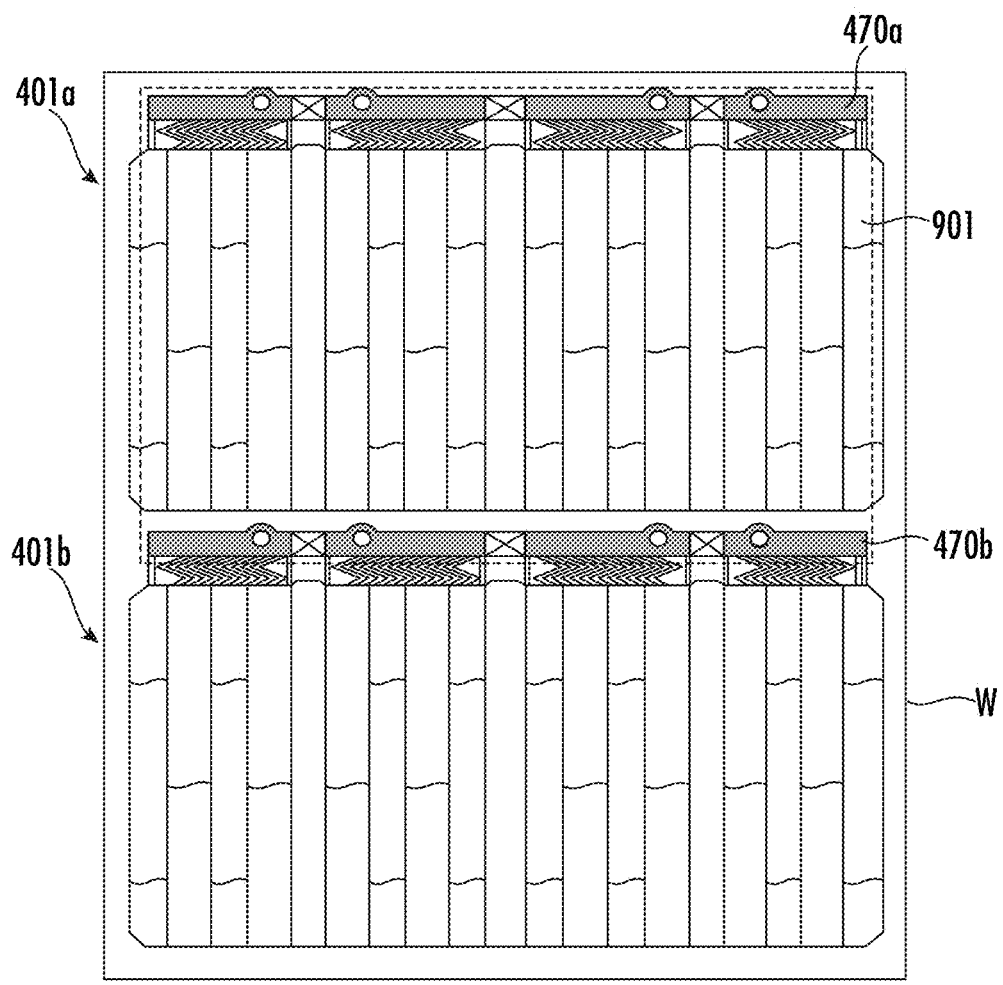
FIG. 10A shows a writing field on a top view of a blackened metallic article, in accordance with some embodiments.

FIG. 10A shows a writing field on a top view of two blackened metallic articles, in accordance with some embodiments. Two blackened half-sized metallic article 401a and 401b are shown which are the same size as one another. The blackened half-sized metallic article 401a may be smaller than the blackened metallic article 400 as shown in FIG. 9A. In some embodiments, the blackened half-sized metallic article 401a may be approximately 140 millimeters by 80 millimeters. As described herein, the writing field for the laser 810 based on some of the laser parameters, may be 200 millimeters by 200 millimeters so an ablation section 901 (shown in broken lines) of this example, may be 150 millimeters by 90 millimeters thereby including two metallic strips 470a and 470b of blackened half-sized metallic articles 401a and 401b in the writing field. The box labeled W indicates the writing field. The flatness fixture 802 and the distinct settings of the laser parameters enable the ablation section 901 so the laser ablation process can be performed on two metallic strips 470a and 470b in one run without having to reposition the mandrel 100 (e.g., workpiece) thus increasing the efficiency of manufacturing.

Figure 10B:
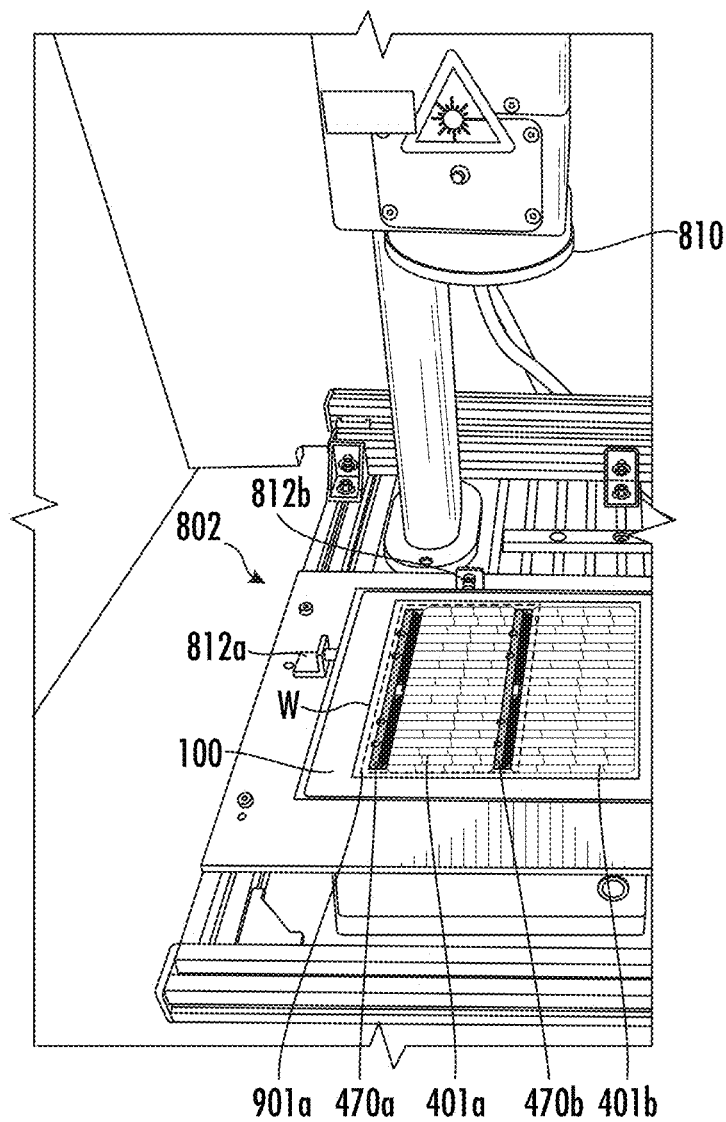
FIG. 10B shows a portion of a front surface of a mandrel on the flatness fixture, in accordance with some embodiments.

FIG. 10B shows a portion of a front surface of a mandrel 100 on the flatness fixture 802, in accordance with some embodiments. In this example, two metallic articles 401a and 401b are located on the front surface of the mandrel 100, and two metallic articles 401c and 401d (shown in FIG. 10C) are located on the back surface of the mandrel 100 for a total of four metallic articles 401a-401d on the same mandrel 100. For example, the mandrel 100 is aligned on the flatness fixture 802 with one or more brackets 812a-812d and the metallic strips 470a and 470b facing upward toward the laser 810. The ablation is performed on the first metallic strip 470a and the second metallic strip 470b in one run since the metallic strips 470a and 470b are included in the ablation section 901a (indicated by broken lines) and the writing field W is 200 millimeters by 200 millimeters. When additional metallic articles 400 are also on the front surface of the mandrel 100, and as described with reference to FIG. 9B, the mandrel 100 is repositioned, such as sliding or rotating the mandrel 100 in the horizontal plane. The mandrel 100 is aligned in the flatness fixture 802 with one or more brackets 812a-812d and the other metallic strips 470 of other metallic articles 400 are ablated within the ablation section 901. After completing the ablation on all of the metallic strips 470 on the front surface of the mandrel 100, it is necessary to reposition the mandrel 100 again, such as flipping over the mandrel 100 or rotating the mandrel 100 in the vertical plane 180 degrees so the back surface of the mandrel 100, including the metallic strips 470, are facing toward the laser 810.

Figure 10C:
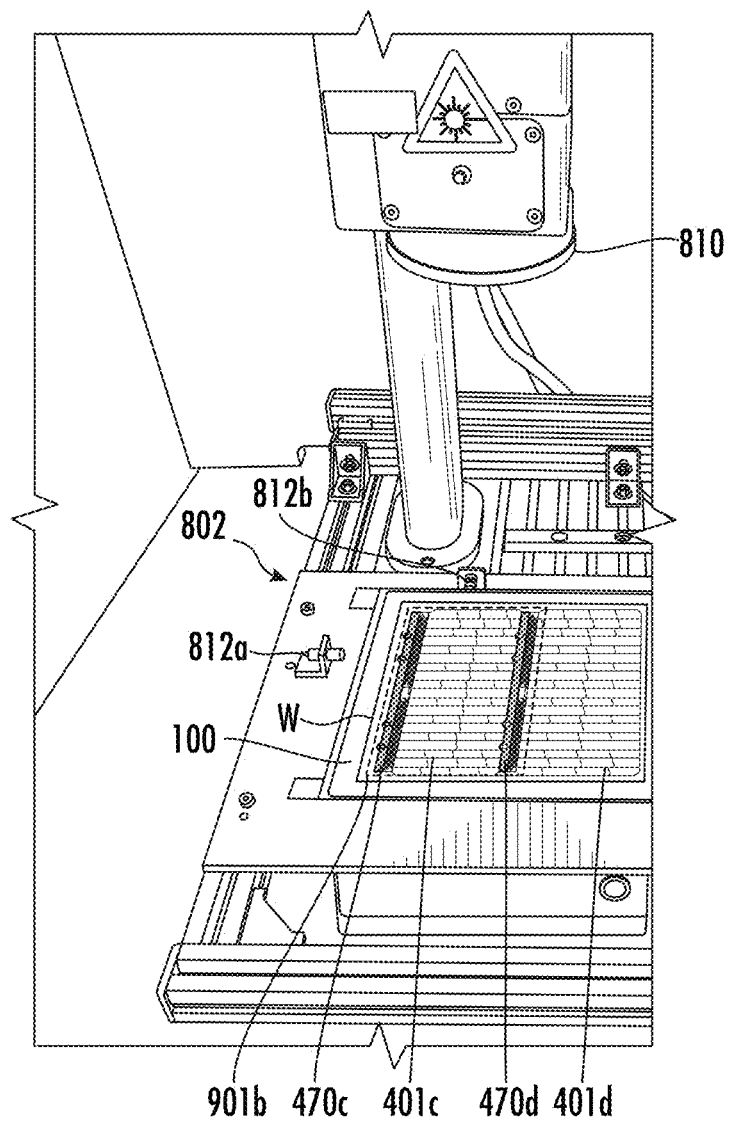
FIG. 10C depicts a portion of a back surface of a mandrel on the flatness fixture, in accordance with some embodiments.

FIG. 10C depicts a portion of a back surface of a mandrel 100 on the flatness fixture 802, in accordance with some embodiments. In this example, two metallic articles 401c and 401d are located on the back surface of the mandrel 100 (FIG. 9B shows the front surface of the mandrel 100 with metallic articles 401a and 401b). After the mandrel is aligned with one or more brackets 812a-812d, the ablation is performed on metallic strips 470c and 470d within the ablation section 901b. When additional metallic articles 401 are also on the back surface of the mandrel 100, and the mandrel 100 is repositioned, such as sliding or rotating the mandrel 100 in the horizontal plane as described herein. The mandrel 100 is aligned with one or more brackets 812a-812d in the flatness fixture 802 and the additional metallic strips 470 within the ablation section 901 are ablated.

FIGS. 11A-11D show a plurality of portions 1100 removed of the black layer on the metallic strip 470, in accordance with some embodiments. The plurality of the portions 1100 provide the electrical contact points for coupling the metallic article 400 (or 401) to the adjacent photovoltaic cell. In some embodiments, there may be six to 15 portions removed of the plurality of the portions 1100 depending on the application. During the ablation, the beam of the laser may ablate one portion at a time before ablating the next portion. The portion number and size depend on the application so that the metallic article 400 (or 401) is securely coupled to the photovoltaic cell.

Figure 11A:
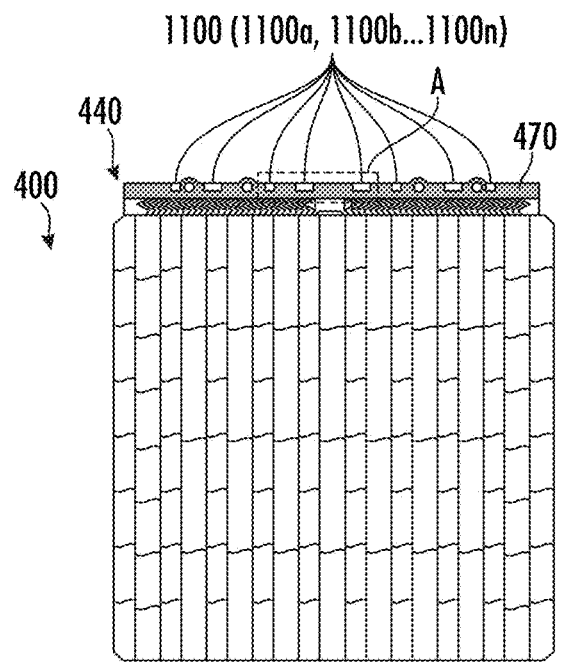
FIGS. 11A-11D show a plurality of portions removed of the black layer on the metallic strip, in accordance with some embodiments.
Figure 11B:
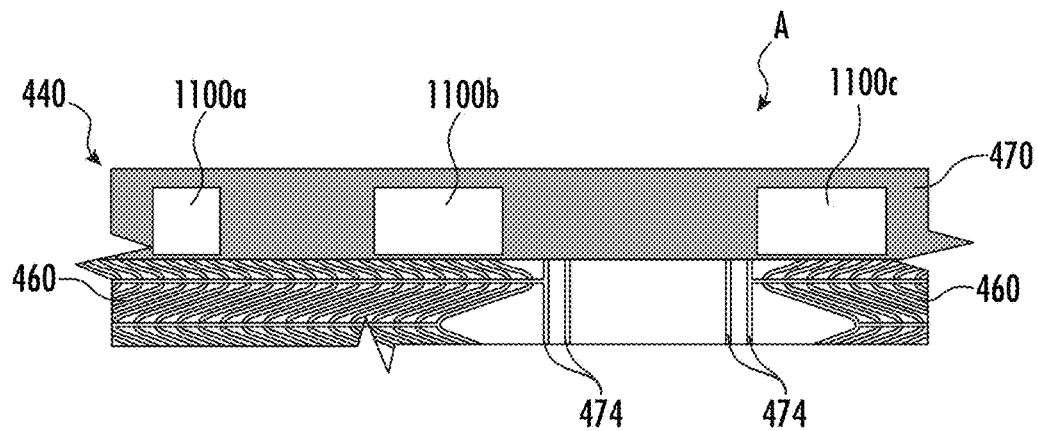

FIG. 11A shows a plurality of portions 1100 of removed black layer on the metallic strip 470, in accordance with some embodiments. In this example, the plurality of the portions 1100 of the black layer removed illustrated is eight portions. FIG. 11B depicts a close-up view of a section of the cell-to-cell interconnect 440 in box A of FIG. 11A. The section of the cell-to-cell interconnect 440, metallic strip 470, appendages 460 and links 474 are shown. Each portion 1100a, 1100b . . . 1100n of the plurality of the portions 1100 are spaced apart from one another and may vary in size from one another. The laser parameters may be set to create different patterns and sizes of portions and to achieve removing only the appropriate thickness of the black layer that was deposited during the blackening process. The thickness of the black layer removed is equal to the thickness of the black layer plated or deposited during the blackening process.

Figure 11C:
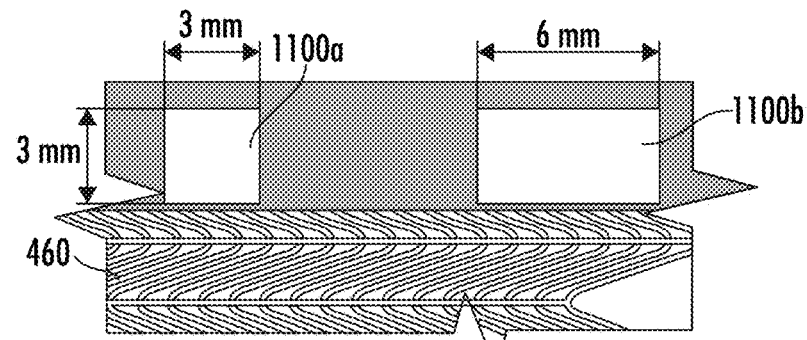
Figure 11D:
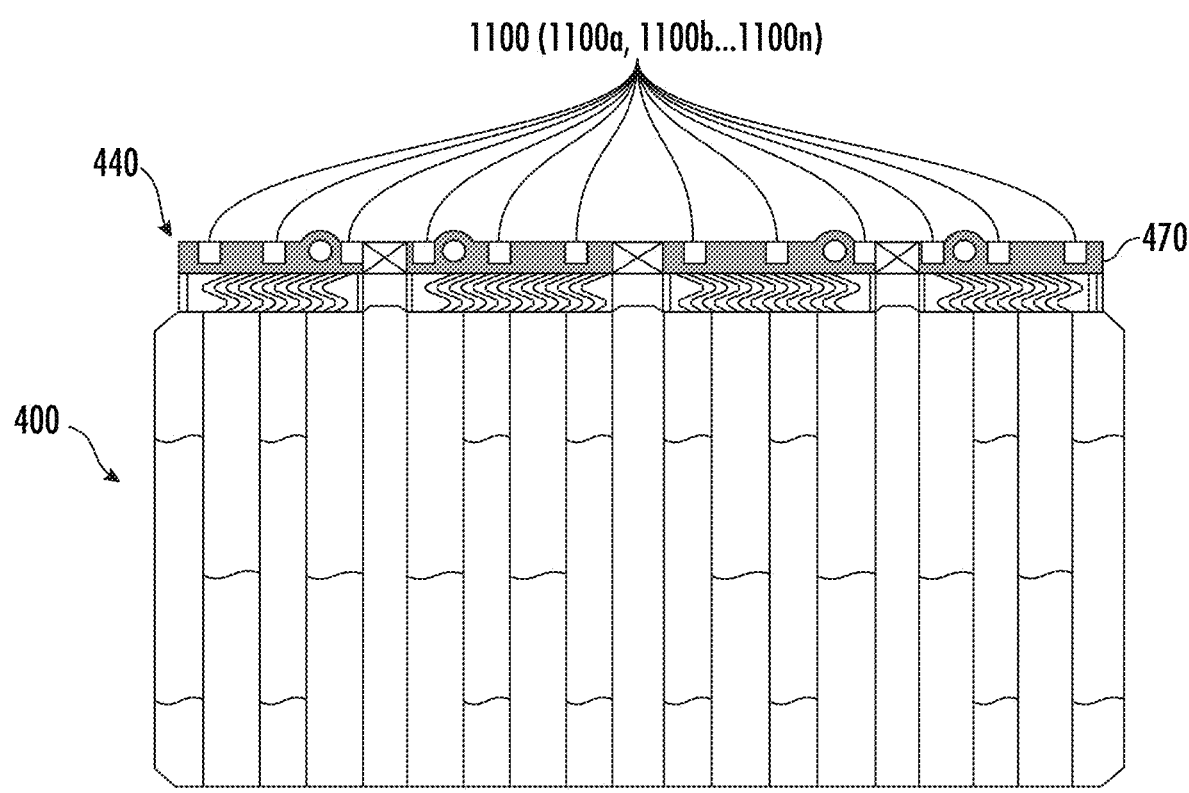

FIG. 11C illustrates a close-up view of a section of the plurality of the portions 1100 of the metallic strip 470 of FIG. 11B. In some embodiments, each portion the plurality of the portions 1100 may have an area of 5 mm$^2$ to 20 mm$^2$ and be sized such as 3 millimeters by 3 millimeters, 3 millimeters by 6 millimeters, or 4 millimeters by 5 millimeters. In some embodiments, each portion the plurality of the portions 1100 may have an area of 8 mm$^2$ to 700 mm$^2$ and be sized such as 3 millimeters by 3 millimeters, 4.5 millimeters by 53 millimeters or 5 millimeters by 140 millimeters. In this example, the portions 1100a and 1100b of the plurality of the portions are shown. Portion 1100a has an area of 9 mm$^2$ and is 3 millimeters by 3 millimeters. Portion 1100b has an area of 18 mm$^2$ and is 3 millimeters by 6 millimeters. FIG. 11D shows the plurality of the portions 1100 on the blackened metallic strip 470 of the metallic article 400, in accordance with some embodiments. In this example, each portion 1100a, 1100b . . . 1100n of the plurality of the portions 1100 are spaced apart from one another and are about the same size as one another.

As disclosed herein, the thickness of the black layer removed is, in some embodiments, between 0.4 microns to 1.5 microns, and equal to the thickness of the black layer plated or deposited during the blackening process. By only removing the thickness of the black layer deposited during the blackening process, the metallic article 400 (or 401) excludes damage from the beam of the laser during the removing of the black layer. Additionally, the mandrel 100 excludes damage from the beam of the laser during the removing of the black layer so that the mandrel 100 can be reused in manufacturing.

FIG. 12 is a table of settings for the laser parameters, in accordance with some embodiments. The columns include combination number 1202, frequency 1204, mark speed 1206 and power output 1208. Each combination A, B, C, D and E define the mark speed and the frequency settings to sufficiently ablate the black layer in a line manner rather than spotted removal, the ablation occurring without damage to the workpiece at a particular power output. For example, in combination E, the power output is in a range from 16 watts to 20 watts, the mark speed is in a range from 1450 millimeters/second to 1550 millimeters/second, and the frequency is in a range from 1900 hertz to 2100 hertz. More specifically, the power output is in a range from 16 watts to 20 watts, the mark speed is 1500 millimeters/second, and the frequency is 2000 hertz. In another example, in combination C, the power output is in a range from 16 watts to 20 watts, the mark speed is in a range from 950 millimeters/second to 1250 millimeters/second, and the frequency is in a range from 950 hertz to 1250 hertz. More specifically, the power output is in a range from 16 watts to 20 watts, the mark speed is 1000 millimeters/second, and the frequency is 1000 hertz. It is noted that more than one combination of the settings of the parameters can produce the desired results. When comparing the combinations A-E, at the same power output, as the mark speed increases, the frequency increases.

The unique settings of the laser parameters as shown in FIG. 12 enables only the black layer thickness deposited during the blackening to be removed and excludes damage to the metallic article and the mandrel during the removing. For example, the beam of the laser 810 strikes the black layer and the underlying electroformed material the metallic article 400 with its specifically tuned fluence rate (power/area moving across the workpiece). The blackened electroformed material absorbs the energy of the beam and is able to dissipate the heat quickly due to the customized laser parameters so the top layer, or the black layer, is evaporated. Once the black layer is removed and the beam may strike the electroformed material directly. The electroformed material such as copper, is conductive and further enhances the heat to spread quickly and dissipate. As a result, there is no damage to the electroformed material and only the black layer thickness is removed. Put another way, for the combinations A-E, because of the conductive property of the electroformed material, the heat from the beam is scattered quickly, and the critical temperature to cause thermal distortion to the electroformed material is not reached. Therefore, there is no damage to the electroformed material.

The unique settings of the laser parameters prevent a "hot spot" from forming during ablation which may damage the workpiece. As disclosed herein, the plurality of the portions of the black layer removed each have an area in the range from 5 mm$^2$ to 20 mm$^2$. This large-sized area is typically not removed by ablation because it is difficult to control the heat, uniformity of the laser beam shape and focus, and timing of the beam of the laser when ablating a large-sized area. For example, the large-sized area may be exposed to longer duration pulses from the beam causing heat to build up in the portion being removed which is known as a hot spot. This phenomenon may be amplified when the thickness of the workpiece is small. As disclosed herein, the thickness of the metallic strip 470 of the cell-to-cell interconnect 440 may have a thickness of 30-100 microns. The development of a hot spot may cause the underlying electroformed material to reach the critical temperature and cause thermal distortion or damage to the electroformed material such as the metallic strip 470.

In some embodiments, the removal of the black layer may be by an etching process to provide an electrical contact and a mechanical bonding surface of the cell-to-cell interconnect 440 to be coupled to a back side of the neighboring photovoltaic cell. In an etching process, portions of the workpiece may be protected from etching by a masking material which resists etching while the other portions of the workpiece not protected by the mask, are etched. Typically, the etchant is a liquid solvent, corrosive leech or acid that reacts with unprotected parts of the workpiece. The reaction may result in the removal of material on the metal surface. In some embodiments, the etchant is applied to the unmasked portions of the blackened metallic strip 470, or to the first plurality of portions of the black layer on the metallic strip 470.

In some embodiments, the plurality of portions of the black layer on the metallic strip 470 of the metallic article 400 may be removed by a masking process to provide the contact surface to be coupled to a back side of the neighboring photovoltaic cell. FIG. 13 is a flowchart for a method 1300 for blackening a metallic electrical conduit for a photovoltaic cell, in accordance with some embodiments. After the blackening in step 604 of FIG. 6, at step 1306, a material known as a mask is applied on the black layer on a second plurality of portions of the metallic strip 470 of the metallic article 400 while in the mandrel. The mask may adhere to and/or cover the second plurality of portions of the black layer. The first and second plurality of portions are different from one another. At step 1308, the first plurality of portions of the black layer on the metallic strip 470 of the metallic article 400 is removed to expose the underlying electroformed material of the metallic article 400. Hence, the black layer thickness on the first plurality of portions is zero. After the removal of the first plurality of portions of the black layer on the metallic strip 470, there is no damage to the metallic strip 470, the metallic article 400 or the mandrel 100. Damage may include distortion or defacement to the underlying electroformed material or to the mandrel 100.

At step 1310, the mask is removed from the second plurality of portions of the black layer. After removal of the mask, the second plurality of portions of the black layer exclude damage or removal from the mask. Damage to the second plurality of portions of the black layer may include distortion, defacement or material removal of the black layer. The second plurality of portions of the black layer have a black layer thickness equal to the black layer thickness that was created during the blackening, e.g, the black layer thickness of the second plurality of portions is unchanged during the removal.

The etchant is selected based on the corrosive properties so that only the black layer is removed without damage to the metallic strip 470, the mandrel 100 or the mask. For example, the black layer in the first plurality of portions of the black layer—the unmasked portions—is removed using the etchant that detrimentally etches the black layer without detrimentally etching the underlying electroformed material of the metallic article 400. In other words, the black layer in the first plurality of portions of the black layer is etched by the etchant at a substantially faster rate than that at which the etchant may etch the underlying electroformed material or the mask. In some embodiments, the etchant may remove the black layer thickness of the first plurality of portions in 20 seconds to 180 seconds. The etchant is selected to remove only the black layer thickness that was created during the blackening. In some embodiments, the black layer deposited in the blackening has a black layer thickness between 0.4 microns to 1.5 microns. In some embodiments, the etchant comprises a nickel stripper, tin stripper or a combination thereof.

In some embodiments, the mask material is an inexpensive material that adheres to or binds with the black layer of the metallic strip 470 forming a mask layer. Great care is taken when applying the mask to the second plurality of portions of the black layer so the desired portions are completely covered with the mask to prevent over or under etching, and so the etchant cannot seep under the mask and damage the metallic article 400 or the mandrel 100. In experimental runs related to the present disclosure, various masking materials were tried such as nitrocellulose, ink, chemical resistant tape, photoresist, and ultraviolet curable resin. In some embodiments, the mask material may comprise ultraviolet curable resin such as ultraviolet curable acrylate urethane. After the first plurality of portions of the black layer on the metallic strip 470 of the metallic article 400 is removed to expose the underlying electroformed material of the metallic article 400, the mask is removed from the second plurality of portions of the black layer. The mask may be removed by a solvent, peeling, scrapping, or pressure.

Figure 14:
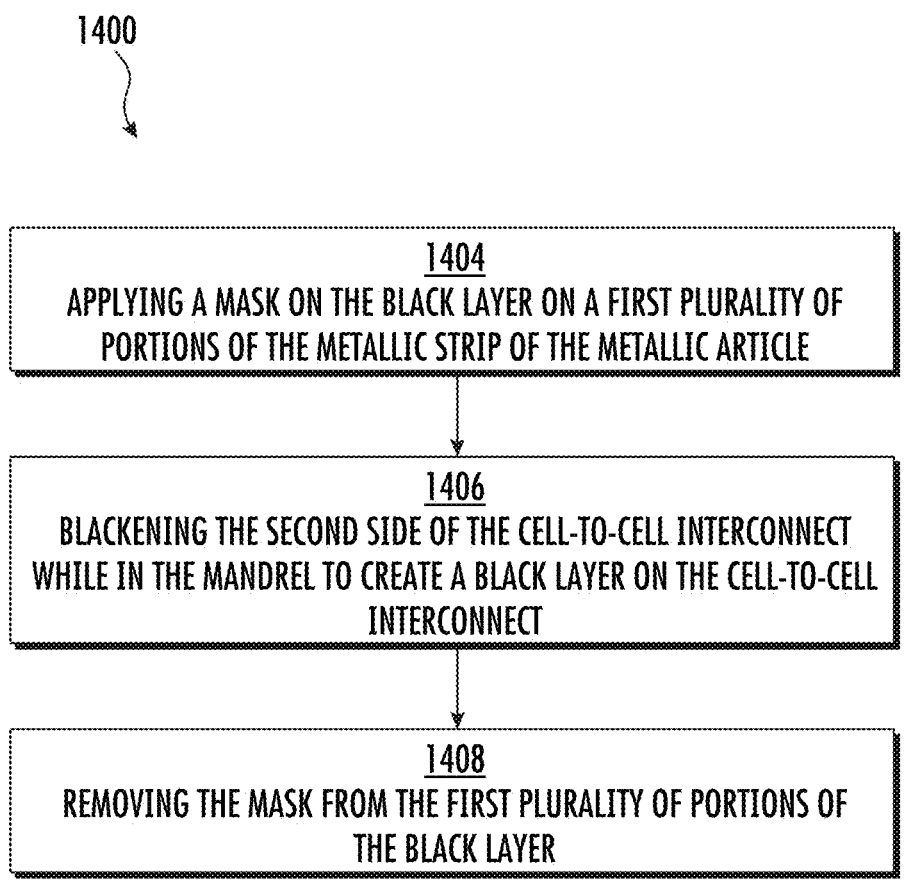

FIG. 14 is a flowchart for a method 1400 for blackening a metallic electrical conduit for a photovoltaic cell, in accordance with some embodiments. In some embodiments, after the providing in step 602 of FIG. 6, at step 1404, a mask is applied on the black layer on a first plurality of portions of the metallic strip 470 of the metallic article 400. At step 1406, the second side of the cell-to-cell interconnect 440, including the metallic strip 470, while in the mandrel, is blackened to create a black layer on the cell-to-cell interconnect 440. Because of the use of the mask, the first plurality of portions of the metallic strip 470 of the metallic article 400 or the masked portions, are covered and protected from the blackening and are not blackened. Hence, the black layer thickness of the first plurality of the portions is zero. In some embodiments, the black layer deposited in the blackening on the second plurality of the portions has a black layer thickness between 0.4 microns to 1.5 microns. At step 1408, the mask is removed from the first plurality of portions of the black layer. After removal of the mask, the first plurality of portions exclude damage or removal from the mask.

The methods 1300 and 1400 use a masking process in the removal of the black layer to create the electrical contact and surface to be coupled to a back side of the neighboring photovoltaic cell. Another option to remove the black layer to create the electrical contact surface may be by photolithography to create a high-resolution mask. Photolithography is a multistep, complicated and very expensive technique. The high expense is due to of the cost of the machines and the need for access to a clean room. Also, photolithography is typically limited to small areas. As described herein, the methods 1300 and 1400 are simple, inexpensive techniques that are able to remove large areas of material such as each portion the plurality of the portions 1100 that may have an area of 5 mm$^2$ to 20 mm$^2$.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of blackening a metallic electrical conduit for a photovoltaic cell, the method comprising:
   providing a mandrel having an electrical conduit electroformed in the mandrel, the electrical conduit having a strip formed in a preformed pattern on an outer surface layer of the mandrel, the strip having a first side adjacent to the outer surface layer of the mandrel and a second side opposite the first side;
   blackening the second side of the electrical conduit while in the mandrel to create a black layer on the electrical conduit, the black layer having a black layer thickness;
   aligning the mandrel in a flatness fixture such that the mandrel is substantially flat, wherein the mandrel remains flat and in a fixed relationship to the flatness fixture throughout the method;
   controlling a beam of a laser toward the black layer, the beam characterized by laser parameters including a power output, a frequency and a mark speed, wherein the laser parameters are selected by setting the power output and the mark speed then determining the frequency so the beam removes a plurality of portions of the black layer;
   removing, by the beam of the laser, a plurality of the portions of the black layer on the strip of the electrical conduit, each removed portion of the plurality of the portions having a thickness equal to the black layer thickness, and a portion area of 9 $mm^2$ to 18 $mm^2$;
   wherein the laser parameters comprise:
     the power output in a range from 10 watts to 25 watts;
     the mark speed in a range from 100 millimeters/second to 2000 millimeters/second; and
     the frequency in a range from 100 hertz to 10,000 hertz.

2. The method of claim 1, wherein the blackening comprises depositing a tin-nickel alloy.

3. The method of claim 1, wherein the mandrel remains flat to the flatness fixture within +/−500 microns.

4. The method of claim 1, wherein the plurality of the portions of the black layer removed comprises at least six portions.

5. The method of claim 1, wherein a writing field area includes the plurality of the portions of the black layer removed, and is in a range from 200 millimeters by 200 millimeters.

6. The method of claim 1, wherein the black layer thickness is 0.4 microns to 1.5 microns.

7. The method of claim 1, wherein the strip has a length of at least 90 millimeters, a width of at least 5 millimeters, and a thickness of 80 microns to 100 microns.

8. The method of claim 1, wherein the electrical conduit and the mandrel exclude damage from the beam of the laser during the removing.

9. The method of claim 1, wherein a diameter of the beam of the laser is 10 microns to 1000 microns.

10. The method of claim 1, wherein the power output is in a range from 16 watts to 20 watts, the mark speed is in a range from 1450 millimeters/second to 1550 millimeters/second, and the frequency is in a range from 1900 hertz to 2100 hertz.

11. The method of claim 1, wherein the power output is in a range from 16 watts to 20 watts, the mark speed is in a range from 950 millimeters/second to 1250 millimeters/second, and the frequency is in a range from 950 hertz to 1250 hertz.

12. A method of blackening an electroformed electrical conduit for a photovoltaic cell, the method comprising:
   blackening a second side of the electroformed electrical conduit while in a mandrel to create a black layer on the electrical conduit, the electrical conduit having a strip formed in a preformed pattern on an outer surface layer of the mandrel, the strip having a first side adjacent to the outer surface layer of the mandrel and a second side opposite the first side, wherein the black layer has a black layer thickness;
   controlling a beam of a laser toward the black layer of the electrical conduit in the mandrel, the mandrel aligned in a flatness fixture such that the mandrel is substantially flat, wherein:
     the mandrel remains flat and in a fixed relationship to the flatness fixture throughout the method;
     the beam characterized by laser parameters including a power output, a frequency and a mark speed, wherein the laser parameters are selected by setting the power output and the mark speed then determining the frequency so the beam removes a plurality of portions of the black layer;
   removing, by the beam of the laser, a plurality of the portions of the black layer on the strip of the electrical conduit, each removed portion of the plurality of the portions having a thickness equal to the black layer thickness, and a portion area of 9 $mm^2$ to 18 $mm^2$.

13. The method of claim 12, wherein the laser parameters comprise:
   the power output in a range from 10 watts to 25 watts;
   the mark speed in a range from 100 millimeters/second to 2000 millimeters/second; and
   the frequency in a range from 100 hertz to 10,000 hertz.

14. The method of claim 12, wherein the blackening comprises depositing a tin-nickel alloy.

15. The method of claim 12, wherein the mandrel remains flat to the flatness fixture within +/−500 microns.

16. The method of claim 12, wherein a writing field area includes the plurality of the portions of the black layer removed, and is in a range from 200 millimeters by 200 millimeters.

17. The method of claim 12, wherein the black layer thickness is 0.4 microns to 1.5 microns.

18. The method of claim 12, wherein the electrical conduit and the mandrel exclude damage from the beam of the laser during the removing.

19. The method of claim 12, wherein the power output is in a range from 16 watts to 20 watts, the mark speed is in a range from 1450 millimeters/second to 1550 millimeters/second, and the frequency is in a range from 1900 hertz to 2100 hertz.

20. The method of claim 12, wherein the power output is in a range from 16 watts to 20 watts, the mark speed is in a range from 950 millimeters/second to 1250 millimeters/second, and the frequency is in a range from 950 hertz to 1250 hertz.

* * * * *